(12) United States Patent
Wu et al.

(10) Patent No.: US 11,502,098 B2
(45) Date of Patent: Nov. 15, 2022

(54) METHODS FOR FORMING THREE-DIMENSIONAL MEMEORY DEVICES WITH DRAIN-SELECT-GATE CUT STRUCTURES

(71) Applicant: YANGTZE MEMORY TECHNOLOGIES CO., LTD., Wuhan (CN)

(72) Inventors: Jianzhong Wu, Wuhan (CN); Zongke Xu, Wuhan (CN); Jingjing Geng, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 16/881,173

(22) Filed: May 22, 2020

(65) Prior Publication Data

US 2021/0335806 A1 Oct. 28, 2021

Related U.S. Application Data

(63) Continuation of application No. PCT/CN2020/086575, filed on Apr. 24, 2020.

(51) Int. Cl.
H01L 27/11582 (2017.01)
H01L 27/1157 (2017.01)
H01L 27/11565 (2017.01)

(52) U.S. Cl.
CPC .... *H01L 27/11582* (2013.01); *H01L 27/1157* (2013.01); *H01L 27/11565* (2013.01)

(58) Field of Classification Search
CPC .................................... H01L 27/115–11597
See application file for complete search history.

(56) References Cited

U.S. PATENT DOCUMENTS 10,103,169 B1 * 10/2018 Ge ................... H01L 27/11575
2013/0107628 A1 * 5/2013 Dong ................ H01L 27/11582
365/185.17

(Continued)

FOREIGN PATENT DOCUMENTS

CN  106340518 A   1/2017
CN  108431957 A   8/2018

(Continued)

OTHER PUBLICATIONS

International Search Report issued in corresponding International Application No. PCT/CN2020/086575, dated Jan. 26, 2021, 5 pages.

(Continued)

*Primary Examiner* — Allen L Parker
*Assistant Examiner* — Gustavo G Ramallo
(74) *Attorney, Agent, or Firm* — Bayes PLLC

(57) ABSTRACT

Embodiments of structures and methods for forming three-dimensional (3D) memory devices are provided. In an example, a 3D memory device includes a core region and a staircase region. The staircase region includes a plurality of stairs each has at least a conductor/dielectric pair extending in a lateral direction. The staircase region includes a drain-select-gate (DSG) cut structure extending along the lateral direction and a vertical direction, and a plurality of support structures extending in the DSG structure along the vertical direction. Of at least one of the support structures, a dimension along the lateral direction is greater than a dimension along a second lateral direction perpendicular to the lateral direction.

20 Claims, 21 Drawing Sheets

(56) References Cited

U.S. PATENT DOCUMENTS

| | | |
|---|---|---|
| 2015/0372101 A1 | 12/2015 | Lee et al. |
| 2019/0326318 A1 | 10/2019 | Jung et al. |
| 2019/0348435 A1 | 11/2019 | Nagata et al. |
| 2020/0027892 A1* | 1/2020 | Zhu .................. H01L 21/76802 |
| 2020/0105785 A1 | 4/2020 | Jung et al. |
| 2020/0185408 A1* | 6/2020 | Song ................ H01L 27/11565 |

FOREIGN PATENT DOCUMENTS

| | | |
|---|---|---|
| CN | 109300908 A | 2/2019 |
| CN | 109326605 A | 2/2019 |
| CN | 110168724 A | 8/2019 |
| CN | 110741475 A | 1/2020 |
| CN | 110770902 A | 2/2020 |
| CN | 110896666 A | 3/2020 |
| TW | 201209827 A | 3/2012 |
| TW | 201926651 A | 7/2019 |

OTHER PUBLICATIONS

Supplemental European Search Report issued in corresponding International Application No. 20926364.9, dated May 3, 2022, 11 pages.

* cited by examiner

METHODS FOR FORMING THREE-DIMENSIONAL MEMEORY DEVICES WITH DRAIN-SELECT-GATE CUT STRUCTURES

CROSS-REFERENCE TO RELATED APPLICATIONS

This application is continuation of International Application No. PCT/CN2020/086575, filed on Apr. 24, 2020, entitled "THREE-DIMENSIONAL MEMORY DEVICES WITH DRAIN-SELECT-GATE CUT STRUCTURES AND METHODS FOR FORMING THE SAME," which is hereby incorporated by reference in its entirety.

BACKGROUND

Embodiments of the present disclosure relate to three-dimensional (3D) memory devices and methods for forming the 3D memory devices with drain-select-gate (DSG) cut structures.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. 3D memory architecture includes a memory array and peripheral devices for controlling signals to and from the memory array.

SUMMARY

Embodiments of 3D memory devices and methods for forming the 3D memory devices with DSG cut structures are provided.

In one example, a 3D memory device includes a core region and a staircase region having a plurality of stairs each has at least a conductor/dielectric pair extending in a lateral direction, the staircase region. The staircase region includes a DSG cut structure extending along the lateral direction and a vertical direction, and a plurality of support structures extending in the DSG structure along the vertical direction. Of at least one of the support structures, a dimension along the lateral direction is greater than a dimension along a second lateral direction perpendicular to the lateral direction.

In another example, a method for forming a 3D memory device includes the following operations. First, a dielectric stack having a plurality of first/second dielectric layer pairs over a substrate is formed. A DSG cut opening is formed in a core region of the dielectric stack. A staircase structure having a plurality of stairs is formed extending along a lateral direction in a staircase region of the dielectric stack. In a different process than the DSG cut opening, a second DSG cut opening is formed in the staircase region and extending along the lateral direction. A DSG cut structure is formed in the DSG cut opening and a second DSG cut structure is formed in the second DSG cut opening.

In a further example, a method for forming a 3D memory device includes the following operations. First, a dielectric stack having a plurality of first/second dielectric layer pairs is formed over a substrate. A channel structure is formed in a core region of the dielectric stack. A staircase structure is formed having a plurality of stairs extending along a lateral direction in a staircase region of the dielectric stack. In a same process, a DSG cut opening is formed in a core region of the dielectric stack and a second DSG cut opening is formed in a staircase region of the dielectric stack. A DSG cut structure is formed in the DSG cut opening and a second DSG cut structure is formed in the second DSG cut opening.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
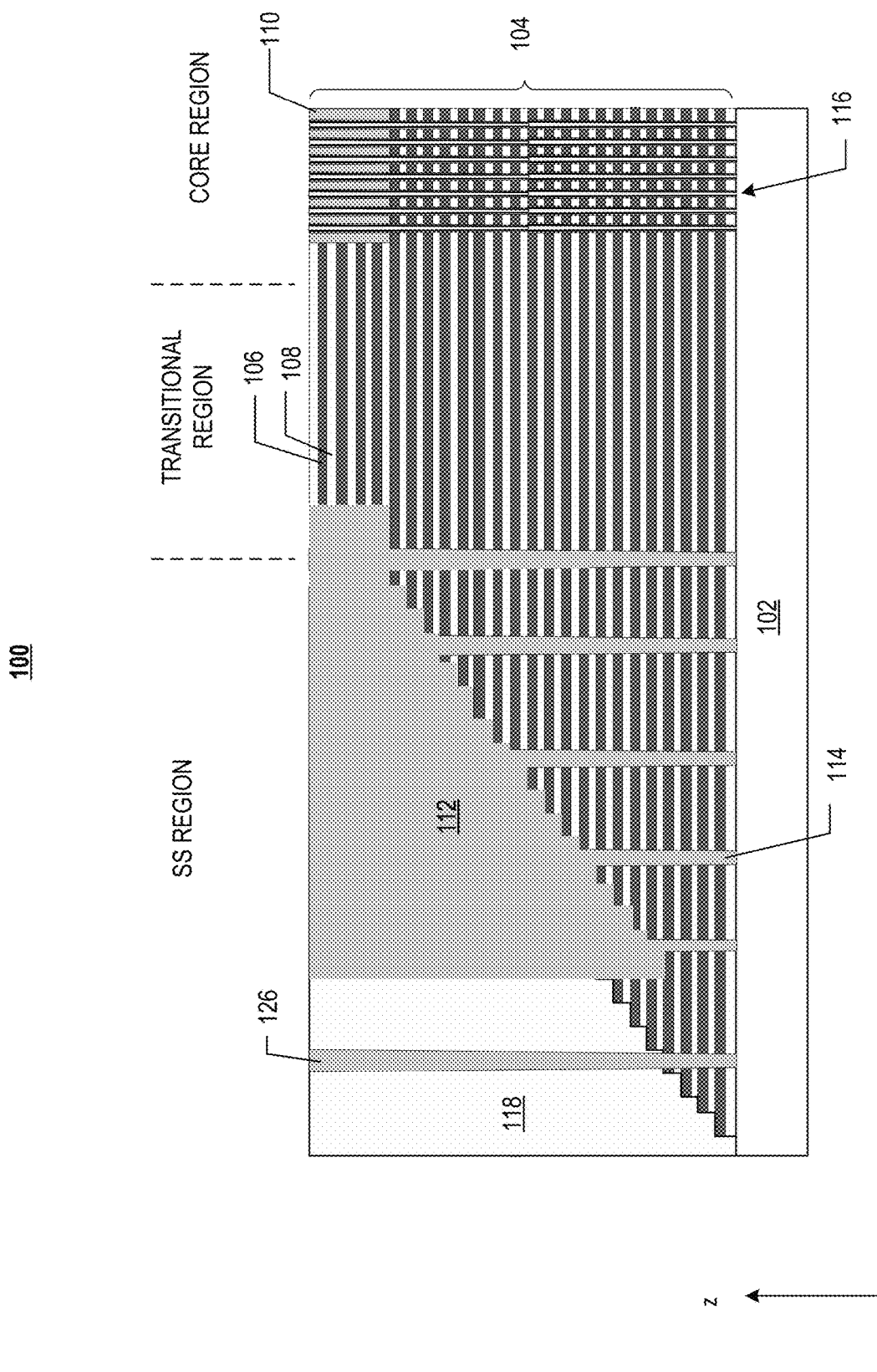
FIG. 1A illustrates a cross-sectional view of an exemplary 3D memory device, according to some embodiments of the present disclosure.

Embodiments of the present disclosure will be described with reference to the accompanying drawings.

DETAILED DESCRIPTION

Although specific configurations and arrangements are discussed, this should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, a staircase structure refers to a set of surfaces that include at least two horizontal surfaces (e.g., along x-y plane) and at least two (e.g., first and second) vertical surfaces (e.g., along z-axis) such that each horizontal surface is adjoined to a first vertical surface that extends upward from a first edge of the horizontal surface, and is adjoined to a second vertical surface that extends downward from a second edge of the horizontal surface. A "step" or "staircase" refers to a vertical shift in the height of a set of adjoined surfaces. In the present disclosure, the term "staircase" and the term "step" refer to one level of a staircase structure and are used interchangeably. In the present disclosure, a horizontal direction can refer to a direction (e.g., the x-axis or the y-axis) parallel with the top surface of the substrate (e.g., the substrate that provides the fabrication platform for the formation of structures over it), and a vertical direction can refer to a direction (e.g., the z-axis) perpendicular to the top surface of the structure.

NAND flash memory devices, widely used in various electronic products, are non-volatile, light-weighted, of low power consumption and good performance. Currently, planar NAND flash memory devices have reached their storage limit. To further increase the storage capacity and reduce the storage cost per bit, 3D NAND memory devices have been proposed. An existing 3D NAND memory device often includes a plurality of memory blocks. Adjacent memory blocks are often separated by a gate line slit (GLS), in which an array common source (ACS) is formed. To further control the memory cells in memory blocks, DSG cut structures, such as top-select-gate (TSG) cut structures, are formed in a memory block. TSG cut structures can be formed in both the core region and the staircase region of a 3D NAND memory device. Conductor layers, e.g., gate electrodes, divided by the TSG cut structures, can be selected so that various operations can be performed on the desired portion (e.g., memory cells) of the 3D NAND memory device.

As the demand for higher memory capacity continues, 3D NAND memory devices with multi-deck structures have been proposed. Compared to existing 3D NAND memory devices, 3D NAND memory devices with multi-deck structures often have more levels (or conductor/dielectric layer pairs or stairs) along the vertical direction. Due to an increased number of levels, the existing methods to form TSG cut structures in the staircase region become challenging. For example, in the existing fabrication process to form a 3D NAND memory device with a dual-deck structure, stairs in the lower deck and upper deck are formed separately, before the formation of the channel structures. The TSG cut structures of the multi-deck structure are formed after the stairs of the upper deck are formed. The formation of the TSG cut structures often includes patterning the stairs and the core region and depositing a dielectric material. As the number of levels increases in a multi-deck structure, stairs of the entire multi-deck structure are formed after the channel structures are partially/fully formed. The TSG cut structures are formed before the formation of the stairs, e.g., by patterning the core region and the staircase region and transferring the pattern onto the stairs. This can cause undesired dielectric material that forms the TSG cut structures, e.g., silicon oxide, to remain on the surfaces of the stairs. The dielectric remains can affect the electrical contact between conductor layers and contacts that land on the conductor layers, impairing the performance of the 3D NAND memory devices.

The present disclosure provides 3D memory devices (e.g., 3D NAND memory devices) having a multi-deck structure with TSG cut structures and methods for forming the 3D memory devices. The 3D memory device includes a stack structure having at least two decks stacking along a vertical direction (e.g., the z-axis) on a substrate. In the staircase region of the 3D memory device, stairs extend along a lateral direction (e.g., the x-axis). A TSG cut structure extends in the stairs, along the lateral direction and the vertical direction, dividing the stairs into a pair of portions. A plurality of support structures (e.g., support pillars or dummy channel structures) align with the TSG cut structure along the lateral direction and overlap with the TSG cut structure along the lateral plane (e.g., extend through or in the TSG cut structure). The support structure can include a dielectric material, such as silicon oxide, and can extend from the top surfaces of the stairs to the bottom of the staircase region (e.g., to be in contact with the substrate). The TSG cut structure includes the same dielectric material as the support structures and has a thickness/depth of at least four conductor/dielectric pairs along the vertical direction.

The lengths/depths of the support structures can be equal to or greater than the depth of the TSG cut structure. In some embodiments, the bottom surface of the TSG cut structure reaches or nominally reaches the bottom of the staircase region (or the top surface of the substrate). That is, the depth of the TSG cut structure can be equal to or nominally equal to the distance between the top surfaces of the stairs, in which the TSC cut structure is located, and the bottom of the staircase structure (or the top surface of the substrate). The lateral dimensions of a support structure can be greater than those of a conventional support structure. In some embodiments, along a second lateral direction (e.g., the y-axis) perpendicular to the lateral direction, the dimension of the support structure is greater than that of the TSG cut structure. In some embodiments, the support structure has an oval shape, of which the dimension along the lateral direction is greater than that of the second lateral direction.

The present disclosure provides various methods to reduce or eliminate undesirable dielectric residues on the stairs in a 3D memory device, improving the electrical contact between conductor layers and the contacts. In the present disclosure, to accommodate more levels in the stack structure, the order to form the staircase region, the TSG cut structures in the core region and the staircase region, the support structures, and the channel structures can vary. The TSG cut structure and the support structures in the staircase region can be formed by the same operation or different operations. TSG cut structures in the staircase region and in the core region can be formed by the same operation or different operations. In some embodiments, the TSG cut structure and channel structures in the core region are formed before the formation of the TSG cut structure and support structures in the staircase region. For example, the portion of the stack structure in the staircase region can be patterned, e.g., using a single photomask and the same etching process, to form the openings of the TSG cut structure and the support structures in the staircase region. The openings to form the TSG cut structure and support structures in the staircase region can also be formed by separate operations. In some embodiments, openings to form the TSG cut structures in the staircase region and the core region can be formed by the same patterning operation after the stairs are formed.

For ease of illustration, TSG cut structures are described, as an example, to explain the formation of DSG cut structures that can be at any suitable positions in a 3D memory device. Usually, a TSG cut structure is formed in the top portions of the core region and the staircase region. However, in various embodiments/applications, the position of a TSG cut structure can be changed as a result of the fabrication process. For example, the TSG cut structure can be, e.g., at the top, middle, or bottom, in a 3D memory device, depending on the fabrication process. In a 3D memory device formed by hybrid bonding, a TSG cut structure in the upper portion of one wafer can be flipped over and positioned at the bottom/middle portion of the bonded structure. That is, although the structure and formation of a TSG cut structure is described herein, the final position of the TSG cut structure in the 3D memory device should not be limited by the embodiments. Thus, the term "DSG cut structure" in the present disclosure is employed to represent a cut structure that is formed by the disclosed method and can be located at any suitable position in a 3D memory device. The DSG cut structure can be a TSG cut structure in a 3D memory device, or be another cut structure located in the middle or bottom of another 3D memory device. Meanwhile, the description of the embodiments in the present disclosure emphasizes the structures and methods to form the staircase region and core region of a 3D memory device. Structures and methods to form other portions of the 3D memory device, e.g., a transitional region between the staircase region and the core region, may be given little or minimal description.

Figure 1B:
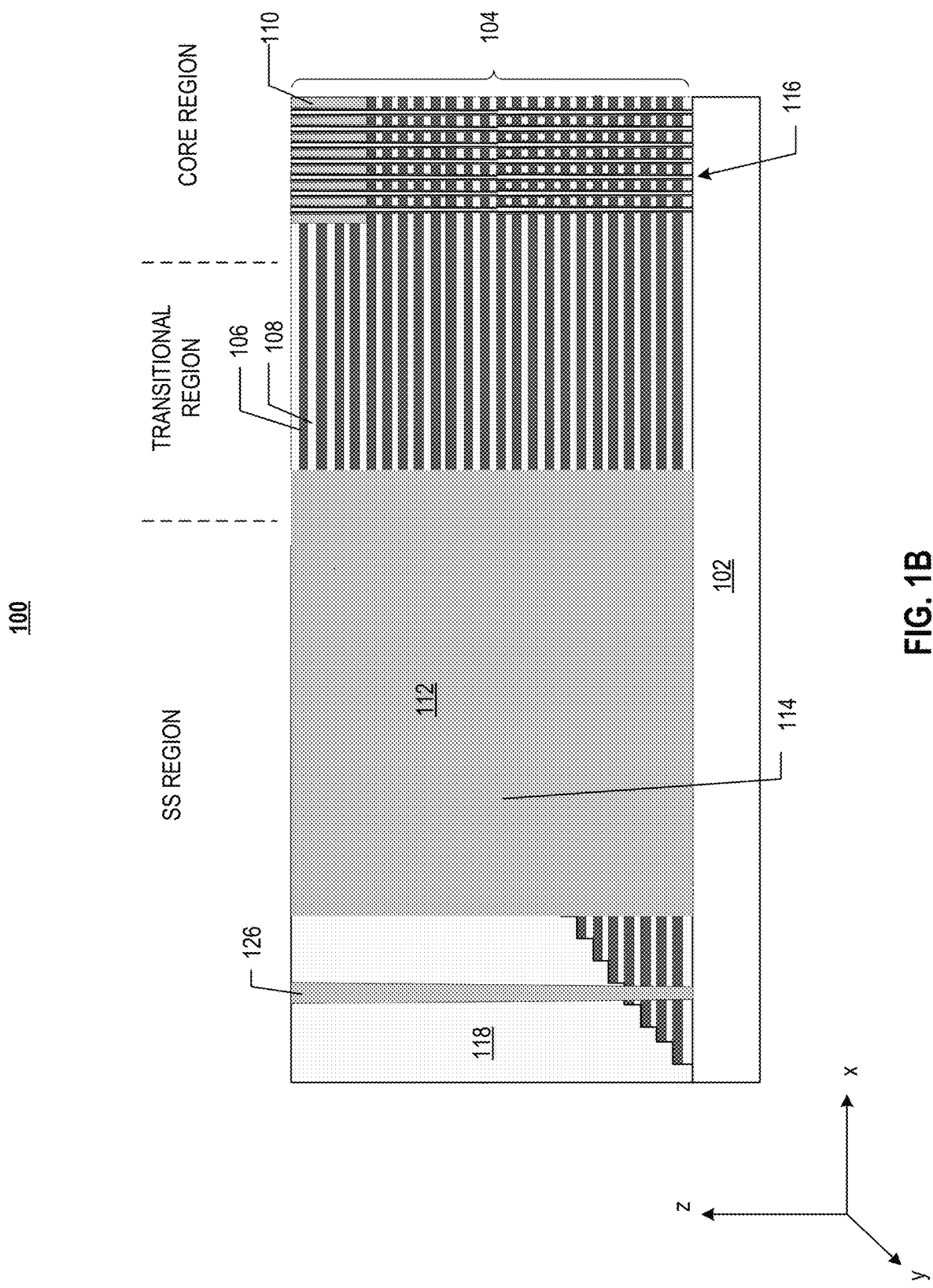
FIG. 1B illustrates a cross-sectional view of another exemplary 3D memory device, according to some embodiments of the present disclosure.
Figure 1C:
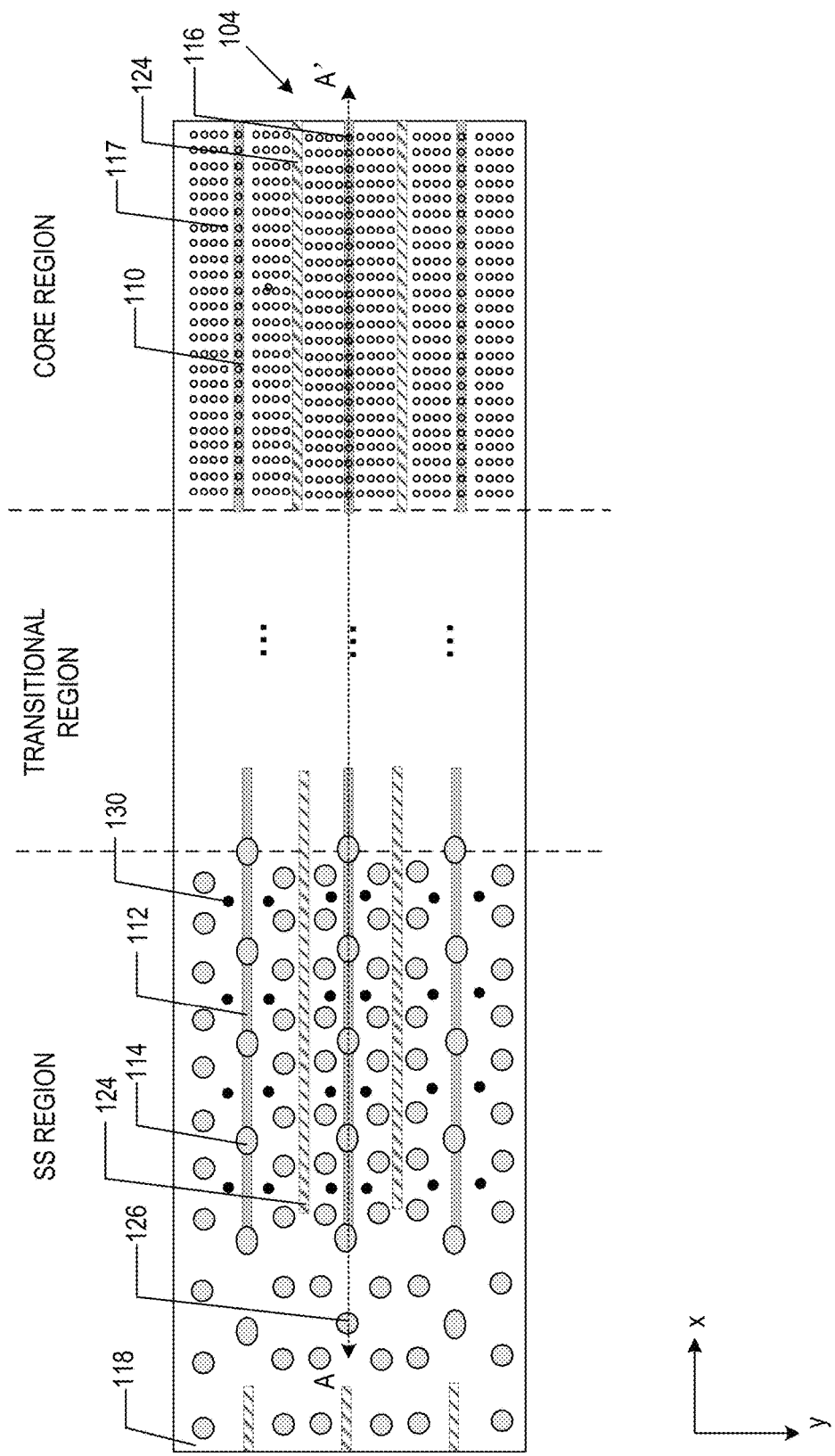
FIG. 1C illustrates a top view of the exemplary 3D memory devices shown in FIGS. 1A and 1B, according to some embodiments of the present disclosure.

FIGS. 1A-1C illustrate an exemplary 3D memory device 100 having a dual-deck structure, according to some embodiments. 3D memory device 100 may include a staircase region ("SS REGION") and a core region ("CORE REGION"), and, optionally, a transitional region ("TRANSITIONAL REGION") in between. FIGS. 1A and 1B each illustrate a cross-sectional view of 3D memory device 100 along the A-A' direction as shown in FIG. 1C (e.g., along the x-z plane). FIGS. 1A and 1B illustrate possible different structures of 3D memory device 100. FIG. 1C illustrates a top view of 3D memory device 100 along the x-y plane.

As shown in FIGS. 1A and 1C, 3D memory device 100 may include a substrate 102 and a stack structure 104 over substrate 102. Stack structure 104 may be a memory stack with a plurality of memory cells. 3D memory device 100 (or stack structure 104) may be divided into a staircase region, a core region, and a transitional region (if any) between the staircase region and the core region. 3D memory device 100 may include a plurality of interleaved conductor layers 106 and dielectric layers 108 extending in the core region, the staircase region, and the transitional region (if any).

In the core region, 3D memory device 100 may include one or more channel structures 117 and one or more dummy channel structures 116 vertically extending in stack structure 104 (e.g., along the z-axis). 3D memory device 100 may include one or more source contact structures 124 extending laterally (e.g., along the x-axis) and vertically in stack structure 104 in the core region and the staircase region. In the core region, 3D memory device 100 may also include one or more TSG cut structures 110 extending laterally (e.g., along the x-axis) and vertically (e.g., along the z-axis). TSG cut structure 110 may be formed over a plurality of dummy channel structures 116, which are distinguishable from channel structures 117. In some embodiments, dummy channel structures 116 do not have drain structures and thus do not function as channel structures 117. Stack structure 104 may include a first memory stack (e.g., as the first deck) over substrate 102, and a second memory stack (e.g., as the second deck) over the first memory stack.

In the staircase region, 3D memory device 100 may include a plurality of stairs extending along the lateral direction (e.g., x-direction). In some embodiments, 3D memory device 100 includes an insulating structure 118 in which stack structure 104 is located. In the staircase region, 3D memory device 100 may also include a TSG cut structure 112 extending in the x-z plane in the stairs, and a plurality of support structures 114 and 126 extending along the vertical direction (e.g., the z-axis). In some embodiments, one TSG cut structure 112 is aligned with a respective TSG cut structure 110 along the x-axis. In some embodiments, each TSG cut structure 112 is in contact with a respective TSG cut structure 110, e.g., through the transitional region (if any).

Substrate 102 can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, substrate 102 is a thinned substrate (e.g., a semiconductor layer), which was thinned by grinding, etching, chemical mechanical polishing (CMP), or any combination thereof. In some embodiments, substrate 102 includes silicon.

Stack structure 104 may include a plurality of interleaved conductor layers 106 and dielectric layers 108. Each conductor layer 106 and a corresponding dielectric layer 108 (e.g., immediately on or immediately under conductor layer 106) may be referred to as a conductor/dielectric layer pair, which may extend from the core region to the staircase region. The intersection of channel structures 117 and conductor layers 106 may form a plurality of memory cells, e.g., an array of memory cells, in 3D memory device 100. The number of the conductor/dielectric layer pairs in stack structure 104 (e.g., 32, 64, 96, or 128) determines the number of memory cells in 3D memory device 100. Conductor layers 106 and dielectric layers 108 may alternate in the vertical direction (e.g., the z-direction). In other words, except for the ones at the top or bottom of stack structure 104, each conductor layer 106 can be adjoined by two dielectric layers 108 on both sides, and each dielectric layer 108 can be adjoined by two conductor layers 106 on both sides. Conductor layers 106 can each have the same thickness or have different thicknesses. Similarly, dielectric layers 108 can each have the same thickness or have different thicknesses. Conductor layers 106 can include conductor materials including, but not limited to, tungsten (W), cobalt (Co), copper (Cu), aluminum (Al), polycrystalline silicon (polysilicon), doped silicon, silicides, or any combination thereof. Dielectric layers 108 can include dielectric materials including, but not limited to, silicon oxide, silicon nitride, silicon oxynitride, or any combination thereof. In some embodiments, conductor layers 106 include metal layers, such as W, and dielectric layers 108 include silicon oxide.

Channel structures 117 may form an array and may each extend vertically above substrate 102. Channel structure 117 can include a semiconductor channel extending vertically through the alternating conductor/dielectric layer pairs. Channel structure 117 can include a channel hole filled with a channel-forming structure of a plurality of channel-forming layers, e.g., dielectric materials (e.g., as a memory film) and/or semiconductor materials (e.g., as a semiconductor layer). In some embodiments, the memory film is a composite layer including a tunneling layer, a memory layer (also known as a "charge trap layer"), and a blocking layer. Optionally, the remaining space of the channel hole can be partially or fully filled with a dielectric core including dielectric materials, such as silicon oxide. Channel structure 117 can have a cylindrical shape (e.g., a pillar shape) through stack structure 104, or have a trapezoid shape in each memory stack and a staggered portion at the interface between adjacent memory stacks (e.g., along the sidewall of channel structure 117). Channel structure 117 may also have any other suitable shapes, which are not limited by the embodiments of the present disclosure. The dielectric core, semiconductor layer, the tunneling layer, the memory layer, and the blocking layer are arranged radially from the center toward the sidewall in this order, according to some embodiments. The semiconductor layer can include silicon, such as amorphous silicon, polysilicon, and/or single crystalline silicon. The tunneling layer can include silicon oxide, silicon oxynitride, or any combination thereof. The memory layer can include silicon nitride, silicon oxynitride, silicon, or any combination thereof. The blocking layer can include silicon oxide, silicon oxynitride, high dielectric constant (high-k) dielectrics, or any combination thereof.

In some embodiments, channel structure 117 further includes a conductive plug (e.g., a semiconductor plug) in the lower portion (e.g., lower end, not shown) of channel structure 117. As used herein, the "upper end" of a component (e.g., channel structure 117) is the end farther away from substrate 102 in the vertical direction, and the "lower end" of the component (e.g., channel structure 117) is the end closer to substrate 102 in the vertical direction when substrate 102 is positioned in the lowest plane of 3D memory device 100. The conductive plug can include a semiconductor material, such as silicon, which is epitaxially grown (e.g., using selective epitaxial growth) from substrate 102 or deposited onto substrate 102 in any suitable directions. It is understood that in some embodiments, the conductive plug includes single crystalline silicon, the same material as substrate 102. In other words, the conductive plug can include an epitaxially-grown semiconductor layer grown from substrate 102. The conductive plug can also include a different material than substrate 102. In some embodiments, the conductive plug includes at least one of silicon, germanium, and silicon germanium. In some embodiments, part of the conductive plug is above the top surface of substrate 102 and in contact with the semiconductor channel. The conductive plug may be conductively connected to the semiconductor channel. In some embodiments, a top surface of the conductive plug is located between a top surface and a bottom surface of a bottom dielectric layer 108 (e.g., the dielectric layer at the bottom of stack structure 104). In some embodiments, a bottom surface of the conductive plug is below the top surface of substrate 102. In some embodiments, the bottom surface of the conductive plug is in contact with the top surface of substrate 102.

In some embodiments, channel structure 117 further includes a drain structure (e.g., channel plug) in the upper portion (e.g., upper end, not shown) of channel structure 117. The drain structure can be in contact with the upper end of the semiconductor channel and may be conductively connected to the semiconductor channel. The drain structure can include semiconductor materials (e.g., polysilicon) or conductive materials (e.g., metals). In some embodiments, the drain structure includes an opening filled with Ti/TiN or Ta/TaN as an adhesion layer and tungsten as a conductor material. By covering the upper end of the semiconductor channel during the fabrication of 3D memory device 100, the drain structure can function as an etch stop layer to prevent etching of dielectrics filled in the semiconductor channel, such as silicon oxide and silicon nitride. In subsequent operations, conductive structures such as vias and/or contact pads can be formed over the drain structure.

In some embodiments, source contact structure 124 extends laterally (e.g., along the x-axis) and vertically (e.g., along the z-axis) in stack structure 104 and is in contact with substrate 102. In some embodiments, source contact structure 124 extends in the core region and the staircase region. Source contact structure 124 may include an insulating spacer and a source contact in the insulating spacer. In some embodiments, source contact structure 124 includes a doped region formed in substrate 102, in contact with and conductively connected to the source contact. In some embodiments, the insulating spacer includes a suitable dielectric material such as silicon oxide, silicon nitride, and/or silicon oxynitride. In some embodiments, the source contact includes a suitable conductive material such as one or more of tungsten, polysilicon, doped silicon, silicides, aluminum, copper, and cobalt. A source voltage can be applied to the memory cells through the doped region and the source contact.

In some embodiments, the memory cells between a pair of source contact structures 124 form a memory finger in a memory block, in which the memory cells are arranged in rows and columns. The number of rows between the two source contact structures 124 can be any suitable number, such as an odd number, e.g., 9. TSG cut structure 110 may be formed along the middle row, e.g., row 5, of the memory finger, to divide the memory cells in the memory finger into two portions. TSG cut structure 110 may be located at the top portion of stack structure 104. Along the z-axis in the core region, TSG cut structure 110 may extend from the top surface of stack structure 104 to at least the third conductor layer 106. In some embodiments, the depth of TSG cut structure 110 is at least four conductor/dielectric layer pairs in the core region. In some embodiments, TSG cut structure 110 includes at least one of silicon oxide and silicon oxynitride.

Figure 2A:
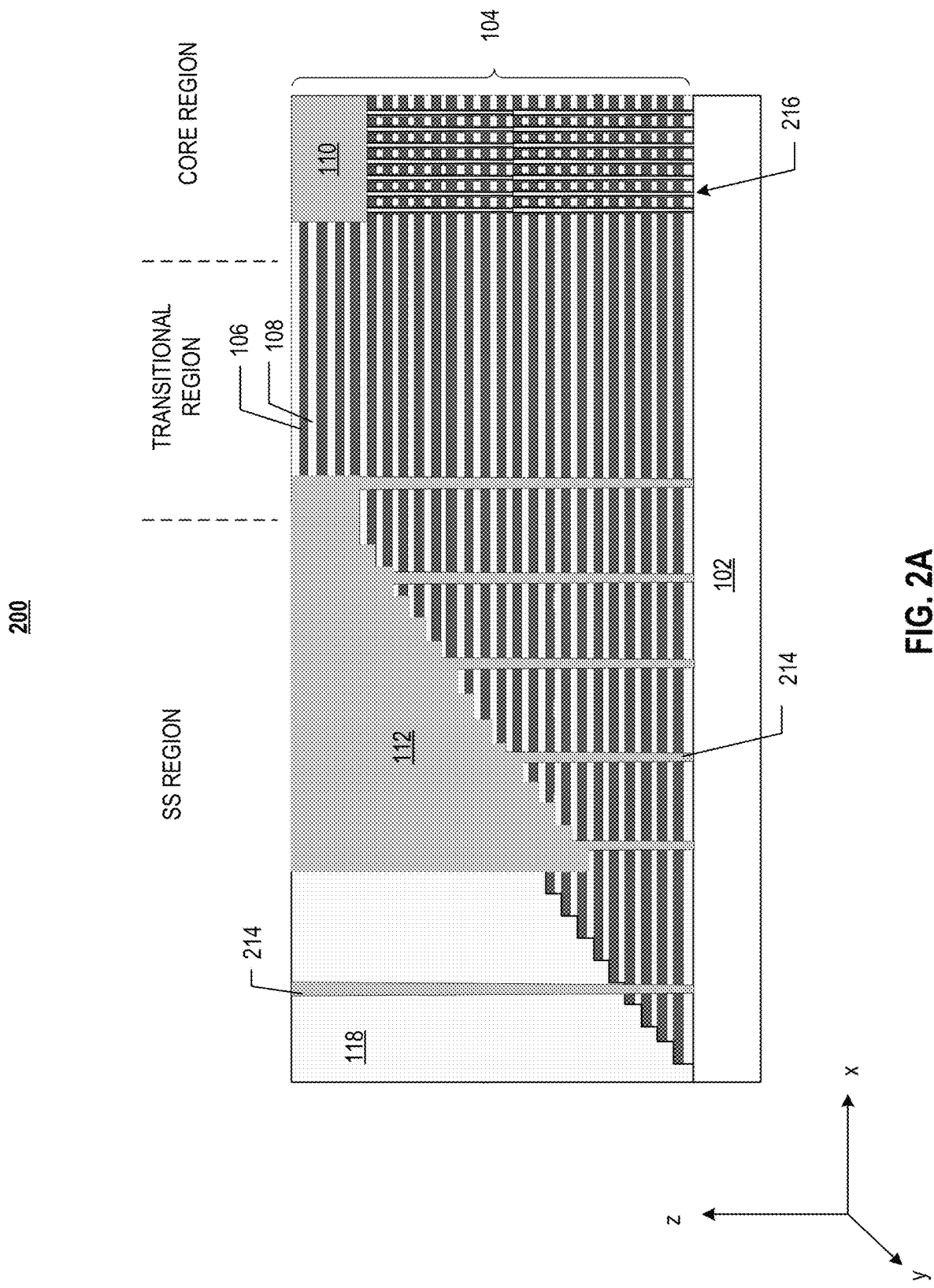
FIG. 2A illustrates a cross-sectional view of another exemplary 3D memory device, according to some embodiments of the present disclosure.
Figure 2B:
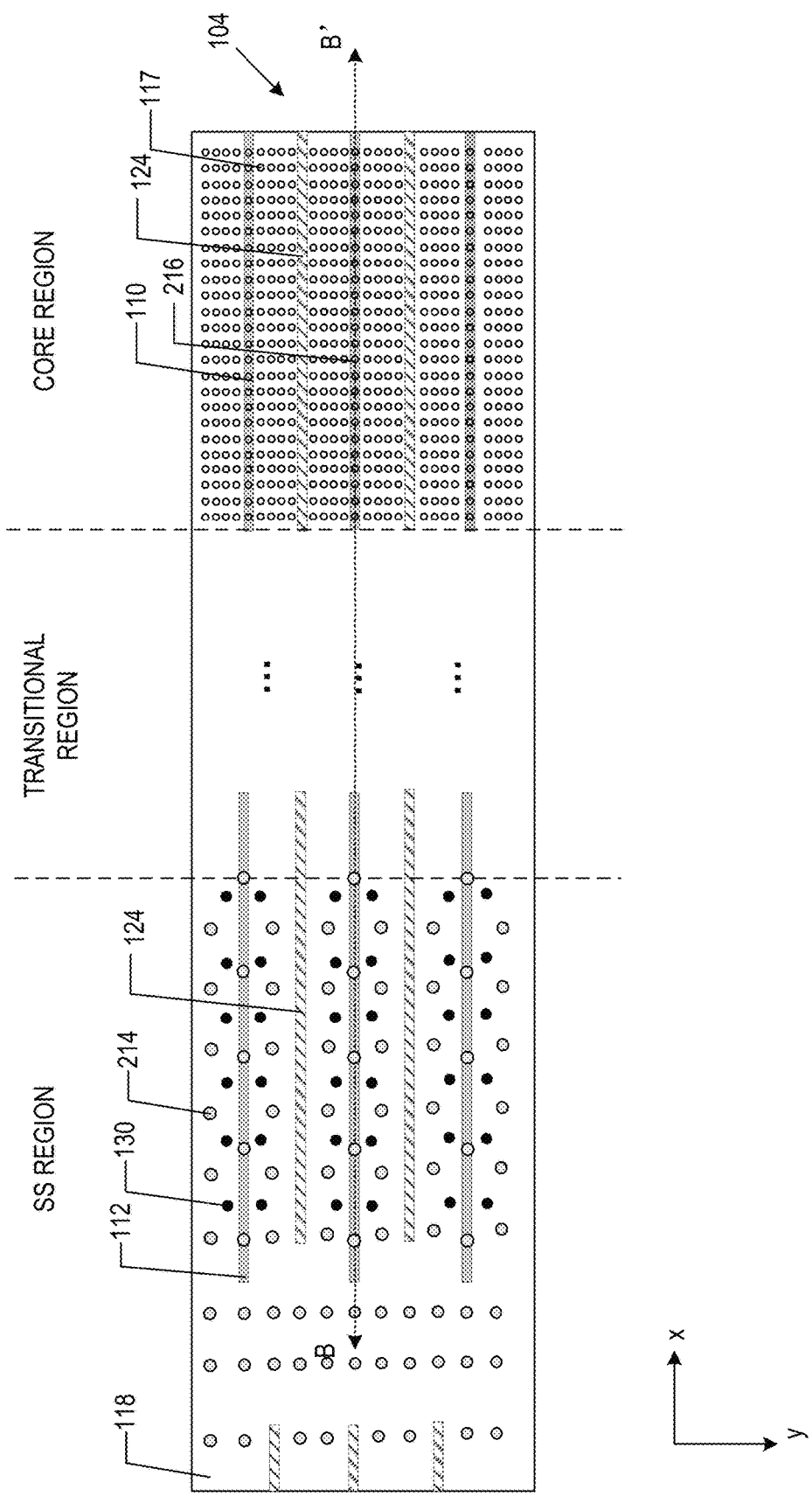
FIG. 2B illustrates a top view of the exemplary 3D memory device shown in FIG. 2A, according to some embodiments of the present disclosure.

Dummy channel structures 116 may be aligned with TSG cut structure in the x-z plane. In various embodiments, dummy channel structures 116 can be located immediately under TSG cut structure 110, or extending through/in TSG cut structure 110. As an example, FIGS. 1A-1C illustrate the structure of 3D memory device 100 having dummy channel structures 116 extending in TSG cut structure 110. In some embodiments, dummy channel structures 116 can be similar to channel structures 117 (e.g., extending from the top surface of stack structure 104 to substrate 102) except for lack of electrical connection to the bit lines. In another example, FIGS. 2A and 2B illustrate the structure of 3D memory device 200 having dummy channel structures 216 located under TSG cut structure 110. In some embodiments, dummy channel structures 116 can have the lower portion of channel structures 117 (e.g., extending from the bottom of TSG cut structure 110 to substrate 102) and without drain structures. In both embodiments, dummy channel structures 116 are disconnected from electrical connection to the bit lines by TSG cut structure 110 and do no function as channel structures 117. In various embodiments, dummy channel structures 116 may be formed in 3D memory device 200, and dummy channel structures 216 may be formed in 3D memory device 100. Details of the structures and fabrication methods are described as follows.

As shown in FIGS. 1A and 1C, the staircase region of 3D memory device 100 may include a staircase structure in which a plurality of stairs extend laterally (e.g., along the x-axis). In the staircase region, TSG cut structure 112 may extend laterally (e.g., along the x-axis) and vertically in the stairs. Along the x-axis, TSG cut structure 112 may extend through at least a portion of the stairs, depending on the design of 3D memory device 100. Along the z-axis in the staircase structure, TSG cut structure 112 may extend from the top surface of a respective stair to at least the fourth conductor layer 106 under the respective top surface. That is, the depth of TSG cut structure 112 is at least four conductor/dielectric layer pairs in the staircase structure. In some embodiments, insulating structure 118 is formed, and TSG cut structure 112 is partially located in insulating structure 118. Insulating structure 118 can include a suitable dielectric material such as silicon dioxide and/or silicon oxynitride. The depth of TSG cut structure 112 can also be regarded as from the top surface of insulating structure 118 to at least the fourth conductor layers 106. For ease of description, in the present disclosure, it is defined that the depth of TSG cut structure 112 in the staircase structure is equal to or greater than four conductor/dielectric layer pairs. Although in the figures of the present disclosure, the contour of TSG cut structure 112 represents a plurality of stairs to illustrate the depth of TSG cut structure 112, the actual shape of TSG cut structure 112 can be arbitrary, depending on the fabrication process. The specific shape and depth of TSG cut structure 112 along the x-z plane should not be limited by the embodiments of the present disclosure.

In the staircase region, 3D memory device 100 includes a plurality of support structures 114 and 126. Support structures 114 may be aligned with TSG cut structure 112 (e.g., along the x-axis), being at least partially overlapping with TSG cut structure 112 along the x-y plane. In some embodiments, support structures 114 extend in TSG cut structure 112. The number of support structures 114 aligned and overlapping with TSG cut structure 112 should not be limited by the embodiments of the present disclosure. Different from support structures 114, support structures 126 may be at any suitable location in the staircase structure and may have no overlap with TSG cut structure 112. Support structures 114 and 126 may extend from the top surfaces of the stairs (or the top surface of insulating structure 118, if any) to the bottom of the staircase structure (or be in contact with substrate 102). In the present disclosure, for ease of illustration, different structures (e.g., support structures 114 and 126, TSG cut structure 112, and insulating structure 118) may be depicted using different shades/patterns. In actual products, these structures may include the same material(s) and may not have clear boundaries (or the boundaries may merge). The shades and patterns of the structures thus do not indicate the differences in material(s) of the structures or actual shapes of the structures.

As shown in FIG. 1C, along the x-y plane, of at least one support structure 114, a dimension along the x-axis may be greater than a dimension along the y-axis. In some embodiments, of each support structure 114, the dimension along the x-axis is greater than the dimension along the y-axis. The cross-section of support structure 114, along the x-y plane, may include any suitable shape such as a rectangular shape, an oval shape, and/or other arbitrary shapes. In various embodiments, the cross-section of support structure 114 may also have other shapes of which the dimensions along the x-axis and the y-axis are nominally the same. For example, the cross-section of support structure 114 may include a circular shape, a squared shape, and/or other arbitrary shapes. In some embodiments, along the y-axis, the dimension of support structure 114 may be greater than the dimension of support structure 114. In some embodiments, along the x-y plane, the area of the cross-section of support structure 114 is greater than an existing support structure. The cross-section of support structure 114 may be a trapezoid shape (e.g., with the dimension along the x-axis gradually decreases towards substrate 102) and/or a pillar shape.

In some embodiments, support structures 126 have the same shape and dimensions as support structures 114. In some embodiments, support structures have different shapes and dimensions than support structures 114, depending on the design of 3D memory device 100. For example, along the x-y plane, the cross-sections of some support structures 126 may have a circular shape, and the cross-sections of some other support structures 126 may have an oval shape, as shown in FIG. 1C. In some embodiments, the cross-section of support structure 126 is greater than an existing support structure. For example, the dimensions of support structure 126 along the x-axis and the y-axis may each be greater than that of an existing support structure. In some embodiments, the cross-section of support structure 126 is nominally equal to that of an existing support structure. In some embodiments, support structures 114 and 126, and TSG cut structure 112 each includes at least one of silicon oxide and silicon oxynitride.

Along the z-axis, the dimension of support structure 114 may be equal to or greater than the depth of TSG cut structure 112. As shown in FIG. 1A, along the z-axis, support structures 114 may extend through TSG cut structure 112, e.g., until reaching substrate 102. As previously described, the depth of TSG cut structure 112 in the staircase structure may be equal to or greater than four conductor/dielectric layer pairs. That is, the bottom surface of TSG cut structure 112 may be nominally equal to or lower than, e.g., along the z-axis, the bottom surface of the fourth conductor layer 106 of the respective stair. In various embodiments, the depth of TSG cut structure 112 can vary. FIG. 1B illustrates TSG cut structure 112 having a different depth than that shown in FIG. 1A. As shown in FIG. 1B, TSG cut structure 112 may extend from top surfaces of stairs to the bottom of the staircase structure (e.g., be in contact with substrate 102). That is, the depth of TSG cut structure 112 in the staircase structure may be equal to the distances between the top surfaces of stairs to the bottom of the staircase structure (e.g., the top surface of substrate 102).

In the staircase region, 3D memory device 100 may include a plurality of contacts 130 in contact with the stairs. For ease of depiction, boundaries of stairs are not shown in the figures of the present disclosure. Contacts 130 may extend in insulating structure 118, in contact with and electrically connected to conductor layers 106. Contacts 130 may conduct word line signals to conductor layers 106. In some embodiments, contacts 130 include a suitable conductive material such as tungsten, cobalt, aluminum, copper, polysilicon, and/or silicides.

FIGS. 2A and 2B illustrate another 3D memory device 200, according to the embodiments of the present disclosure. FIG. 2A illustrates a cross-sectional view of 3D memory device 200 along the B-B' direction as shown in FIG. 2B (e.g., along the x-z plane). FIG. 2B illustrates a top view of 3D memory device 200 along the x-y plane.

Different from 3D memory device 100, 3D memory device 200 may include a plurality of support structures 214 that have smaller cross-sectional areas than those of support structures 114, along the x-y plane. Support structures 214 may be at any suitable location in the staircase region. For example, support structures 214 may extend in/through TSG cut structure 112 and outside of TSG cut structures 112. In some embodiments, along the y-axis, a dimension of support structure 214 is equal to or less than that of TSG cut structure 112. The cross-section of support structure 214, along the x-y plane, may be any suitable shape such as a squared shape, a circular shape, and/or other arbitrary shapes. The cross-section of support structure 214 may be a trapezoid shape (e.g., with the dimension along the x-axis gradually decreases towards substrate 102) and/or a pillar shape. In some embodiments, support structures 214 each include at least one of silicon oxide and silicon oxynitride.

3D memory devices 100 and 200 can each be part of a monolithic 3D memory device. The term "monolithic" means that the components (e.g., the peripheral device and memory array device) of the 3D memory devices are formed on a single substrate. For monolithic 3D memory devices, the fabrication encounters additional restrictions due to the convolution of the peripheral device processing and the memory array device processing. For example, the fabrication of the memory array device (e.g., NAND channel structures) is constrained by the thermal budget associated with the peripheral devices that have been formed or to be formed on the same substrate.

Alternatively, 3D memory devices 100 and 200 can each be part of a non-monolithic 3D memory device, in which components (e.g., the peripheral device and memory array device) can be formed separately on different substrates and then bonded, for example, in a face-to-face manner. In some embodiments, the memory array device substrate (e.g., substrate 102) remains as the substrate of the bonded non-monolithic 3D memory device, and the peripheral device (e.g., including any suitable digital, analog, and/or mixed-signal peripheral circuits used for facilitating the operation of 3D memory devices 100 and 200, such as page buffers, decoders, and latches; not shown) is flipped and faces down toward the memory array device (e.g., NAND memory strings) for hybrid bonding. It is understood that in some embodiments, the memory array device substrate (e.g., substrate 102) is flipped and faces down toward the peripheral device (not shown) for hybrid bonding, so that in the bonded non-monolithic 3D memory device, the memory array device is above the peripheral device. The memory array device substrate (e.g., substrate 102) can be a thinned substrate (which is not the substrate of the bonded non-monolithic 3D memory device), and the back-end-of-line (BEOL) interconnects of the non-monolithic 3D memory device can be formed on the backside of the thinned memory array device substrate.

Figure 3:
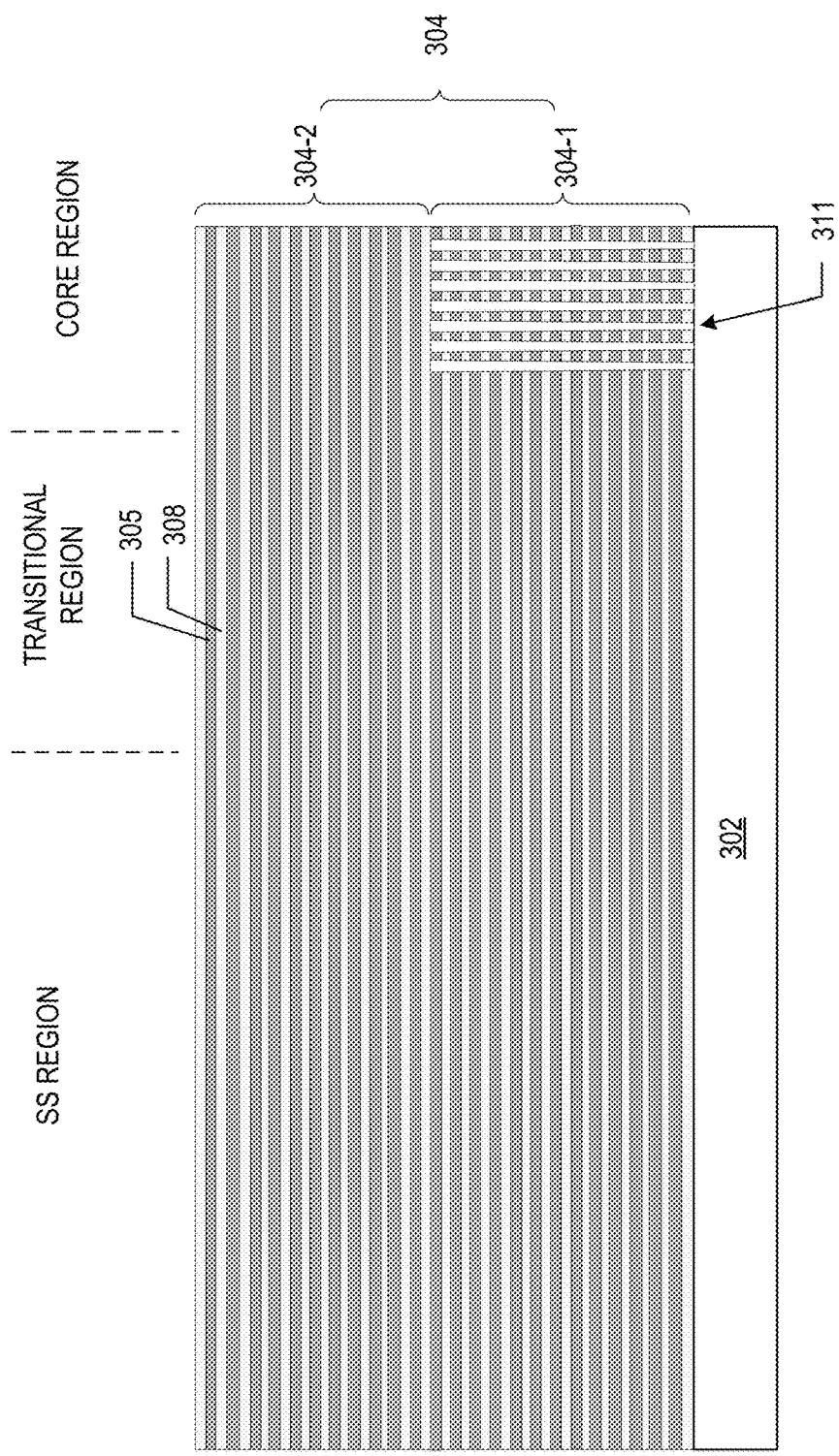
FIG. 3 illustrates a cross-sectional view of a 3D memory device formed by an exemplary fabrication process, according to some embodiments of the present disclosure.
Figure 5A:
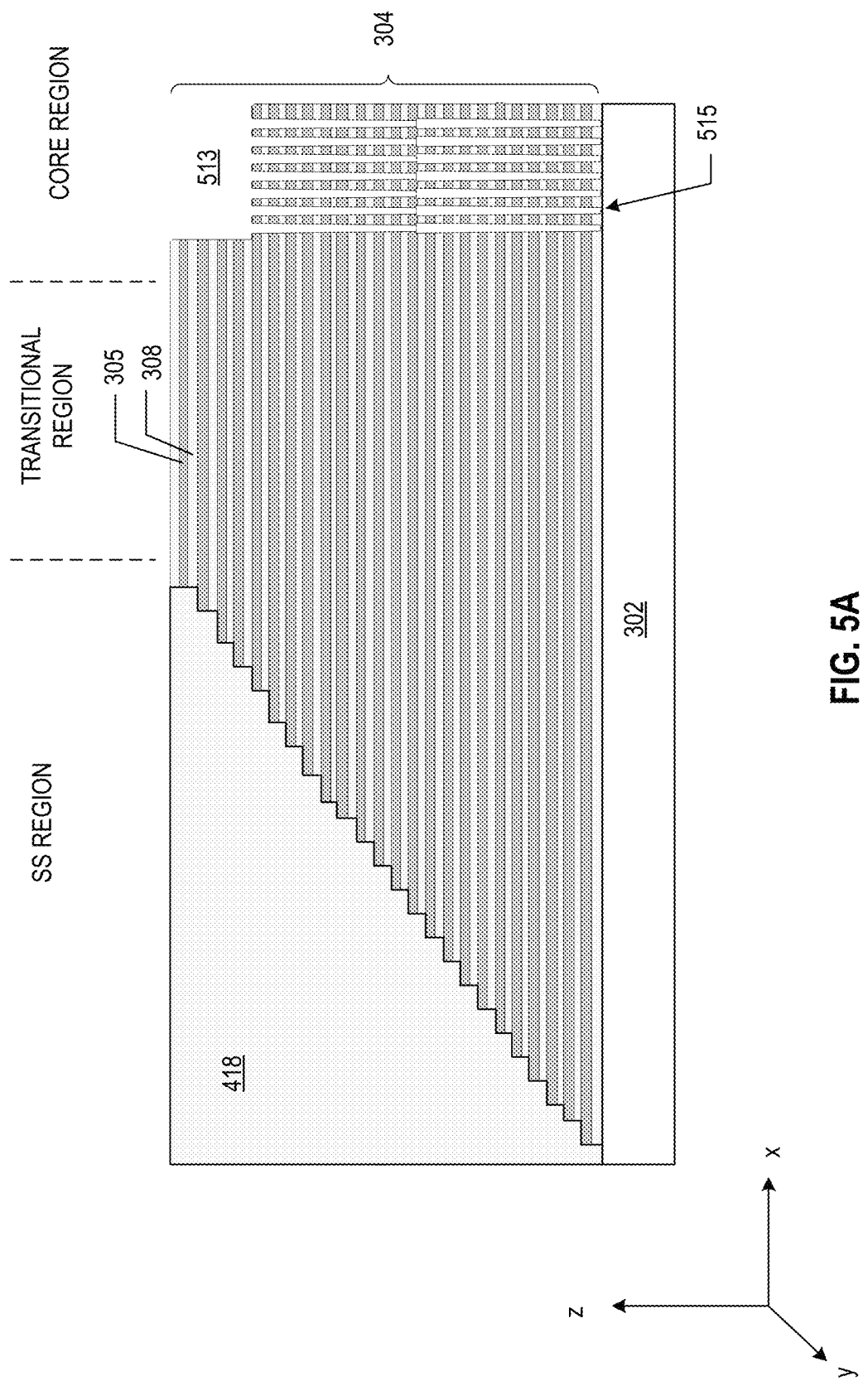
FIGS. 5A-5D illustrates cross-sectional views of another 3D memory device at various stages of another exemplary fabrication process, according to some embodiments of the present disclosure.
Figure 5B:
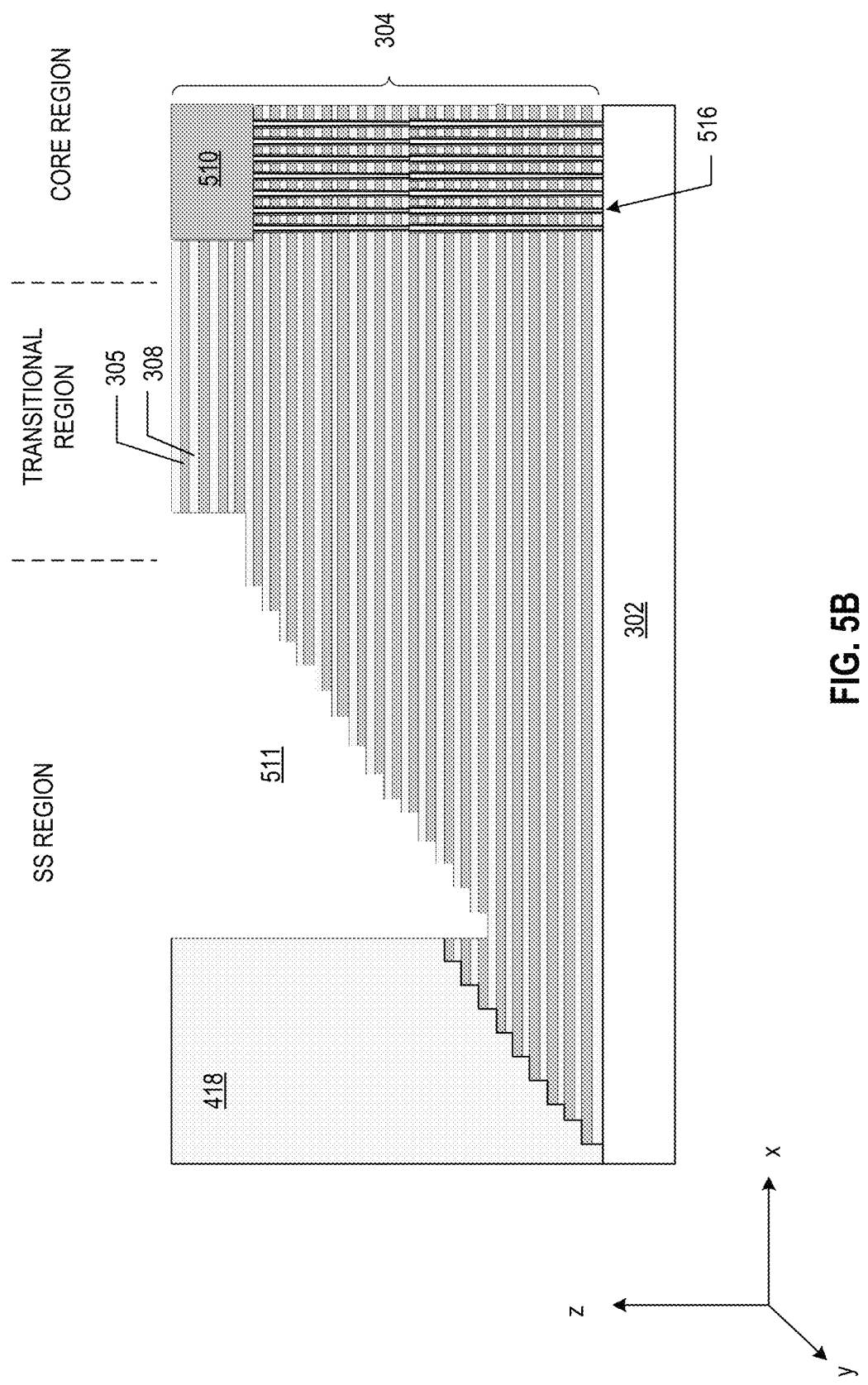
Figure 5C:
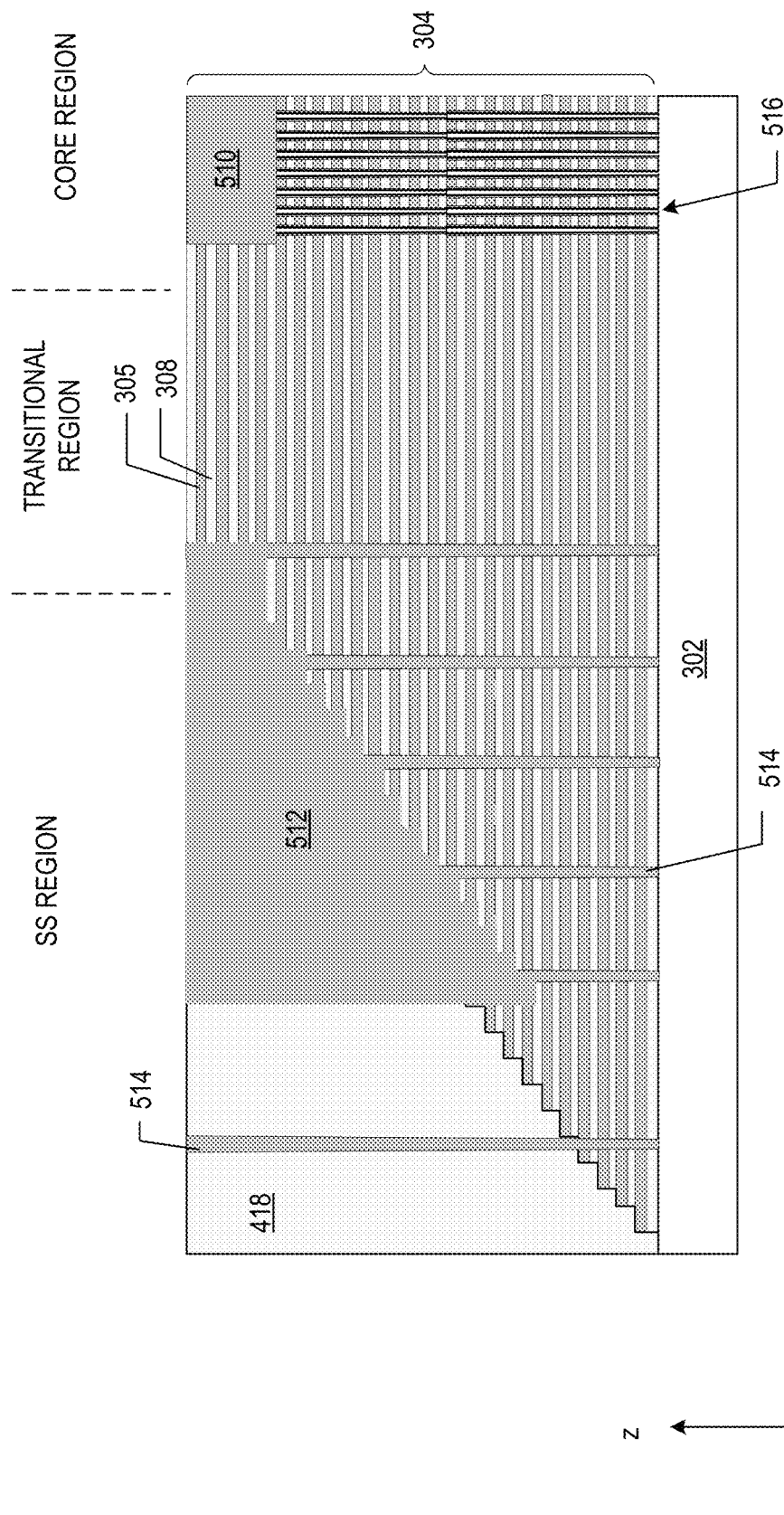
Figure 5D:
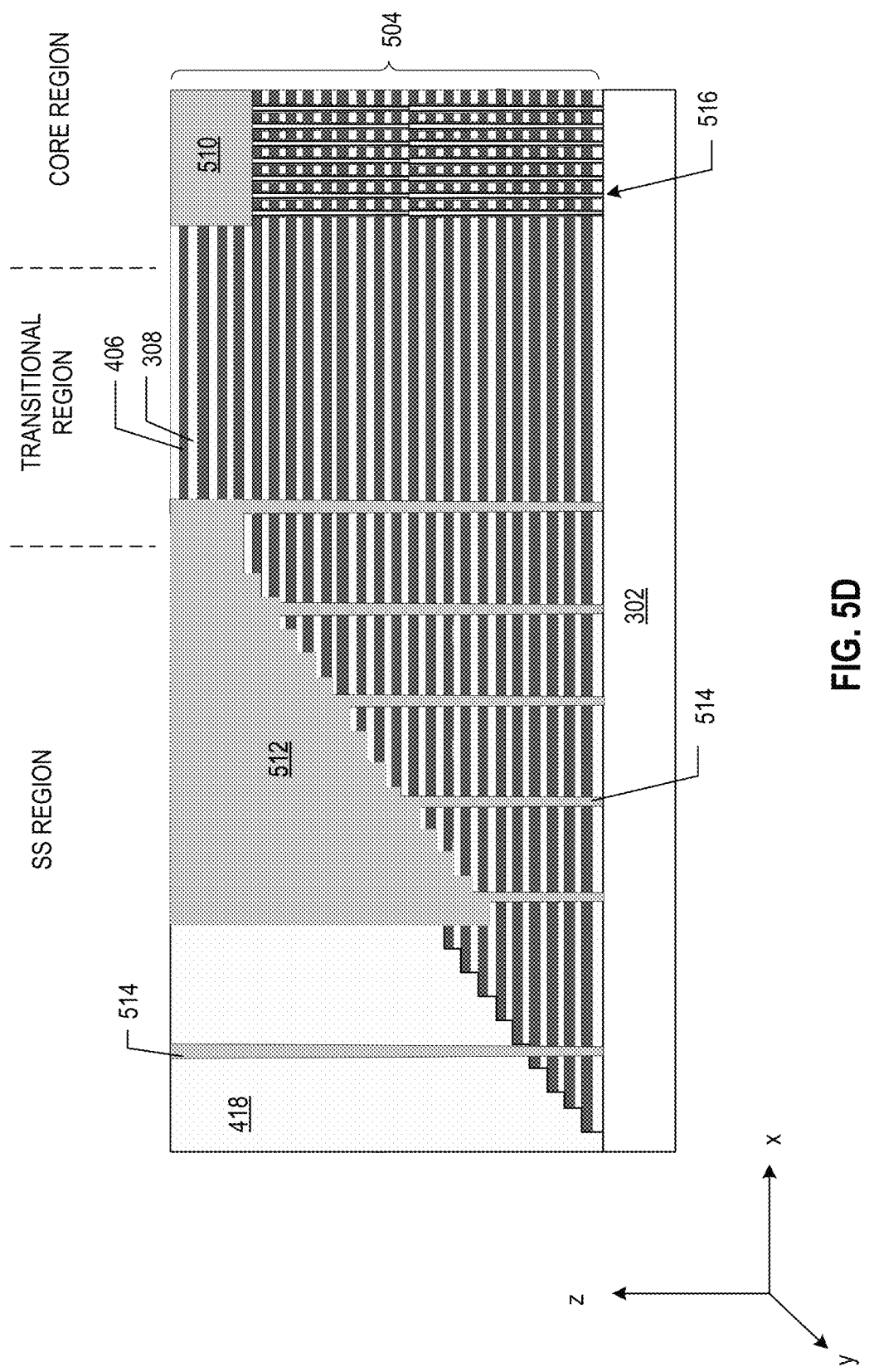
Figure 6A:
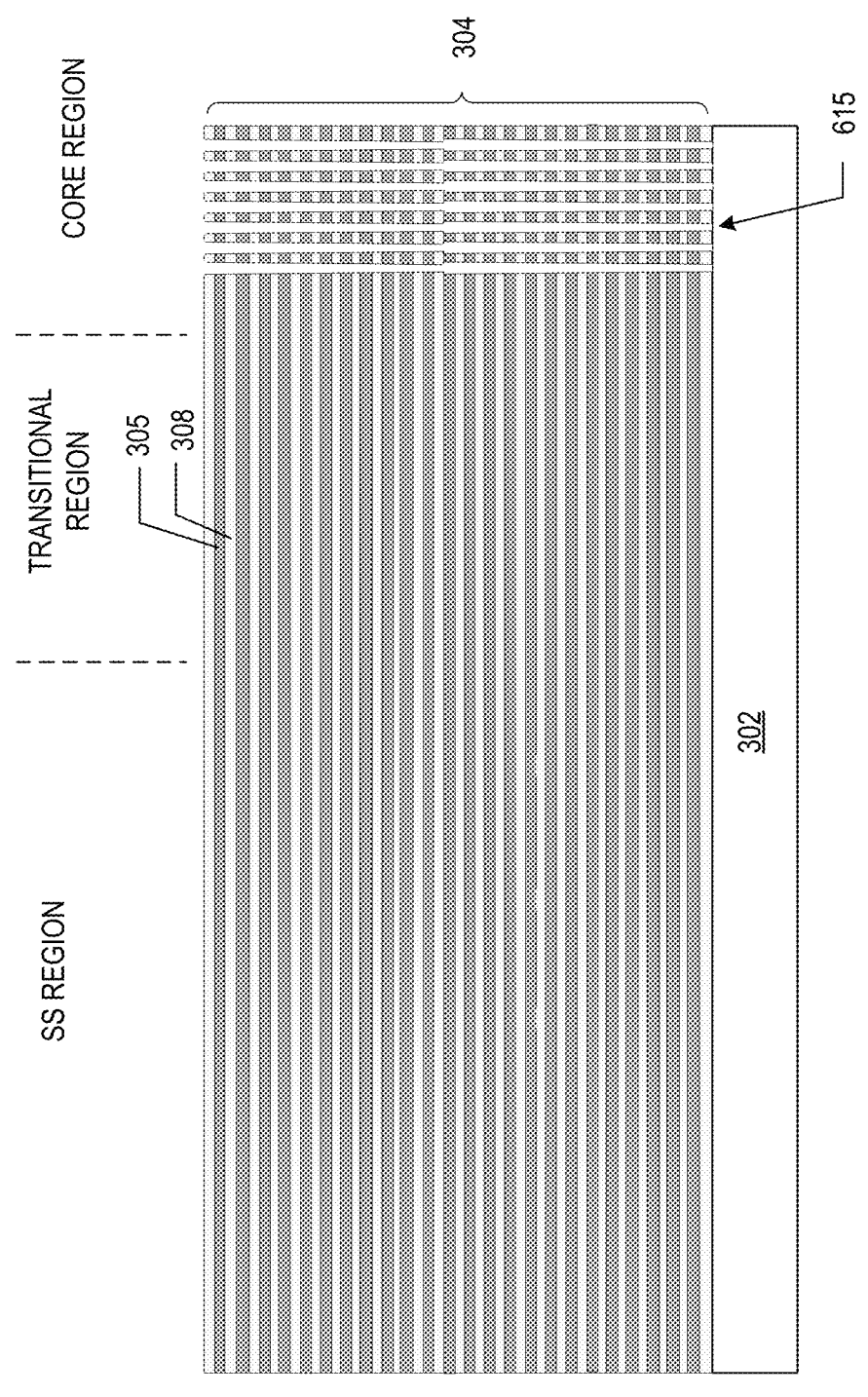
FIGS. 6A-6D illustrates cross-sectional views of another 3D memory device at various stages of another exemplary fabrication process, according to some embodiments of the present disclosure.
Figure 6B:
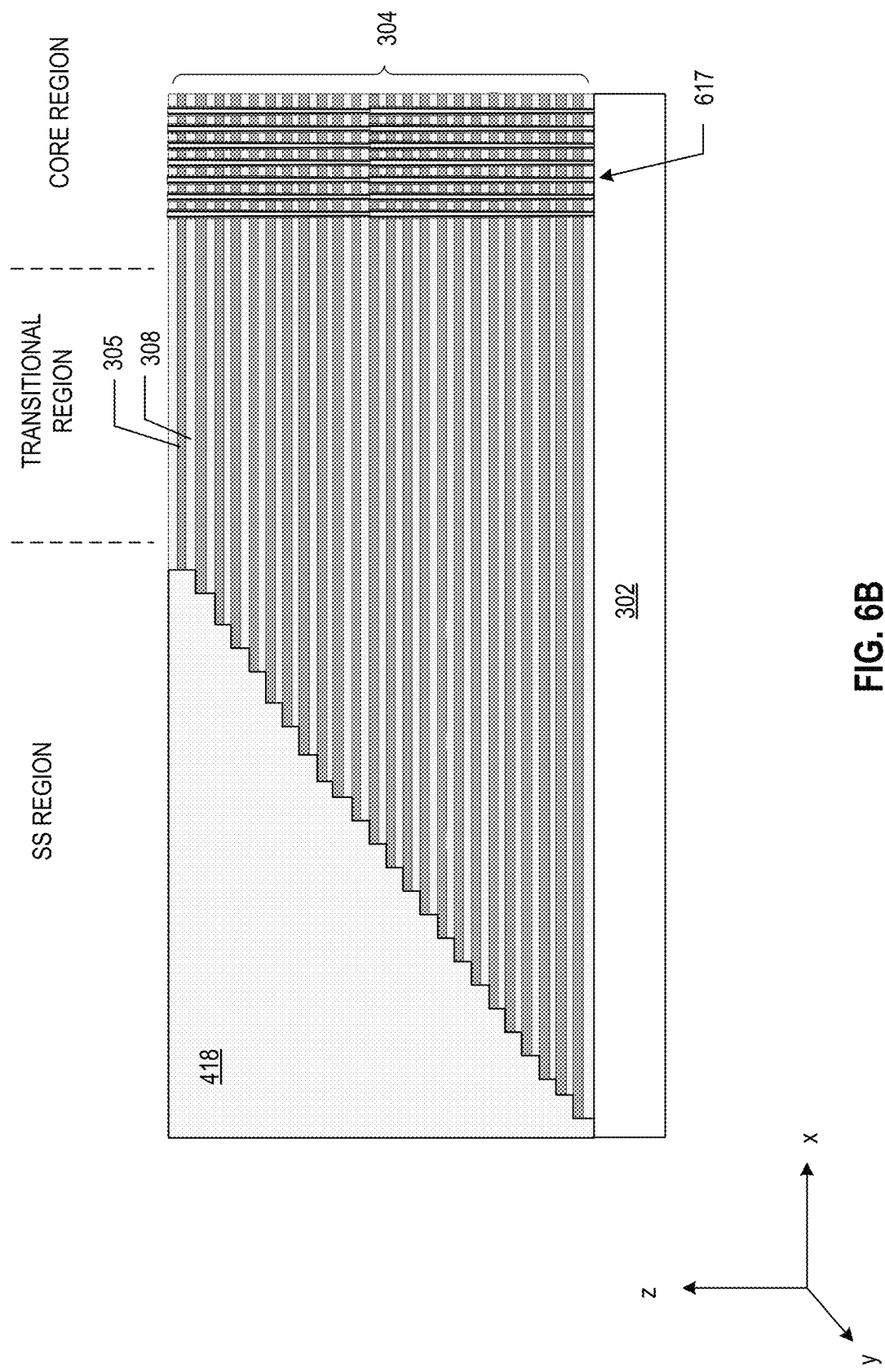
Figure 6C:
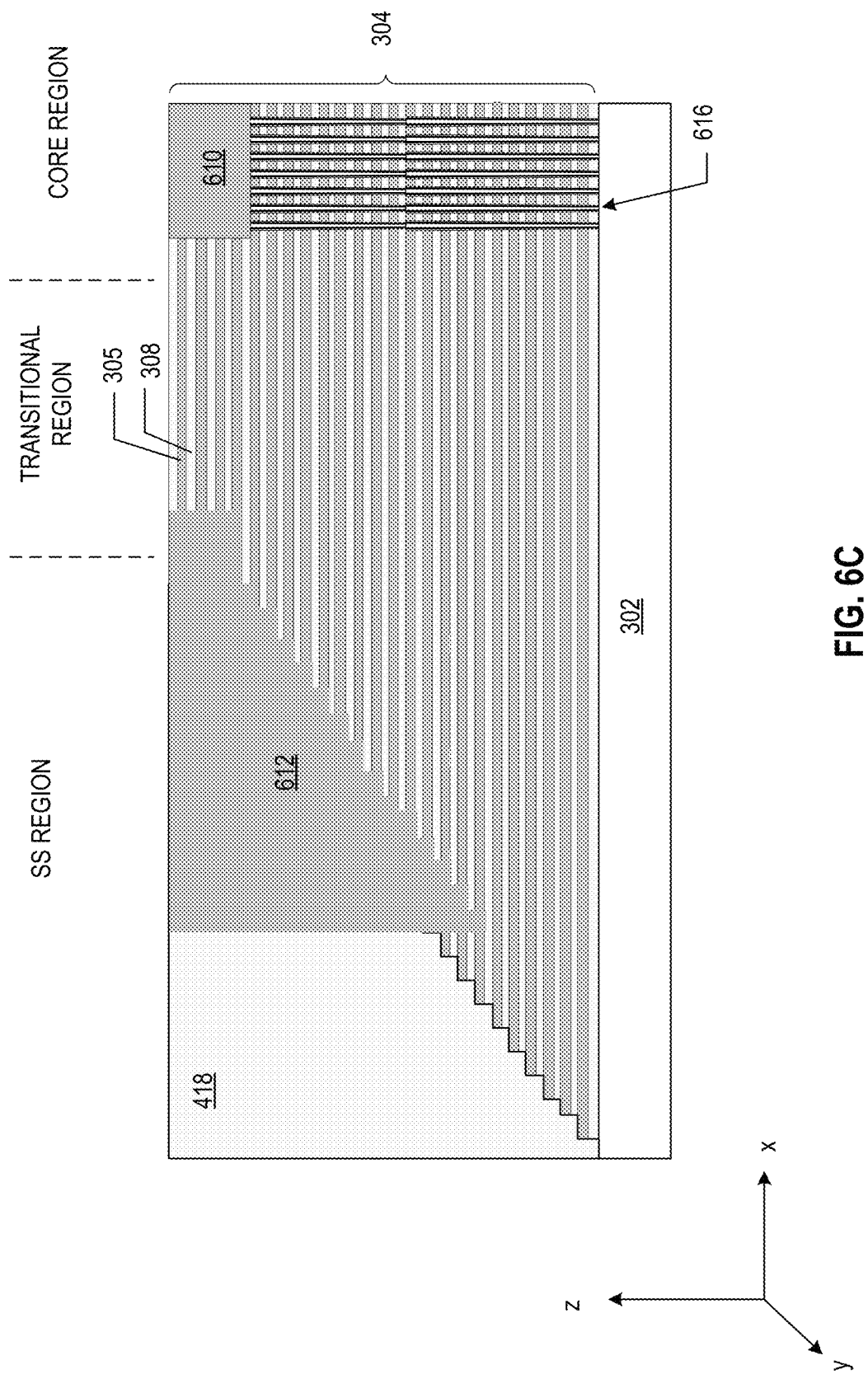
Figure 6D:
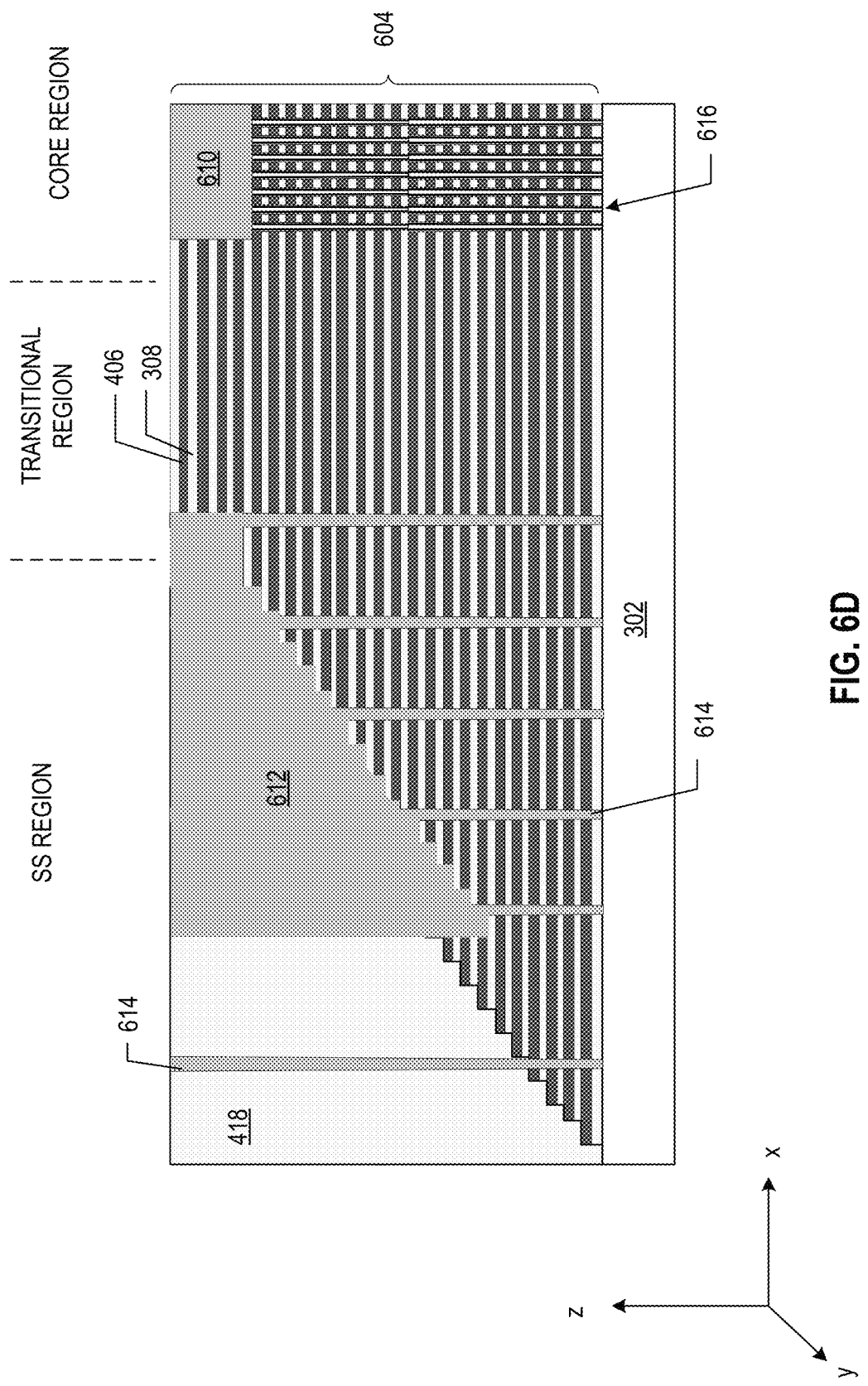
Figure 7:
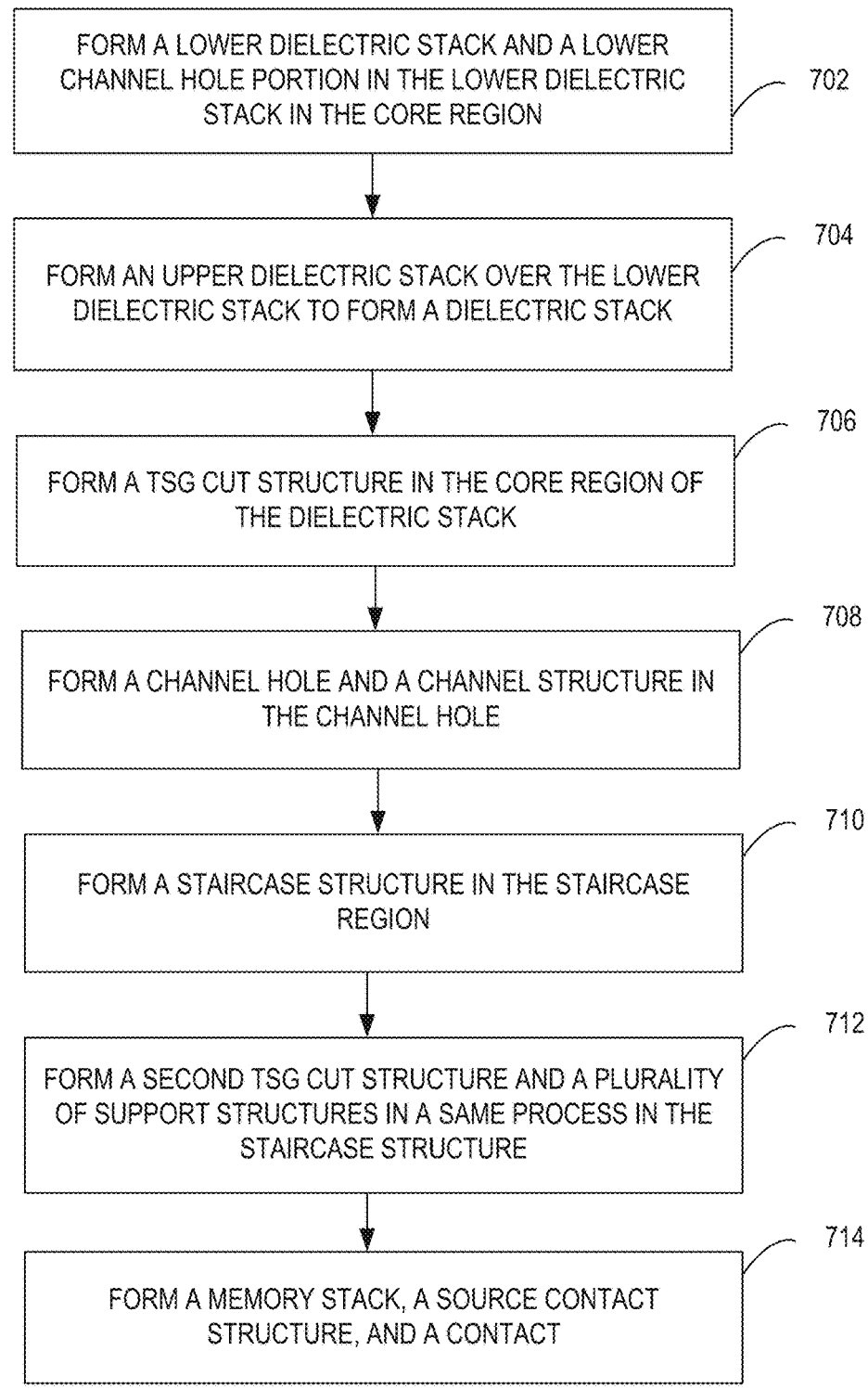
FIG. 7 illustrates a flowchart of exemplary fabrication operations shown in FIGS. 3 and 4A-4D, according to some embodiments of the present disclosure.

In the present disclosure, the fabrication processes illustrated in FIGS. 4A-4D, 5A-5D, and 6A-6D are respectively based on the structure of 3D memory device formed in FIG. 3. FIGS. 3 and 4A-4D illustrate cross-sectional views of 3D memory device 100 at various stages of a fabrication process, according to some embodiments. FIG. 7 illustrates a flowchart of a method 700 for forming 3D memory device 100. For ease of illustration, 3D memory device 100 has a dual-deck structure. In various embodiments, a 3D memory device may also have more than two memory stacks along the vertical direction (e.g., the z-direction). The fabrication of structures in a 3D memory device with more than two memory decks can be similar to the fabrication of 3D memory device 100 and is not described herein. It is understood that the operations shown in method 700 are not exhaustive and that other operations can be performed as well before, after, or between any of the illustrated operations. Further, some of the operations may be performed simultaneously, or in a different order than shown in FIGS. 3 and 4A-4D.

As shown in FIG. 7, at the beginning of the process, method 700 starts with Operation 702, in which a lower dielectric stack and a lower channel hole portion are formed in the core region, over a substrate. FIG. 3 illustrates a corresponding structure.

As shown in FIG. 3, a lower dielectric stack 304-1 may be formed over a substrate 302, and a lower channel hole portion 311 (or a first channel hole portion) may be formed in the core region of lower dielectric stack 304-1. Lower dielectric stack 304-1 may be formed over substrate 302 by alternatingly depositing a plurality of first dielectric layers 305 and a plurality of second dielectric layers 308 over substrate 302. First dielectric layers 305 and second dielectric layers 308 may have different etching selectivity during the subsequent gate-replacement process. In some embodiments, first dielectric layers 305 and second dielectric layers 308 include different materials. In some embodiments, first dielectric layers 305 function as sacrificial layers in the gate-replacement process. In some embodiments, first dielectric layers 305 include silicon nitride, and second dielectric layers 308 include silicon oxide. The deposition of first dielectric layers 305 and second dielectric layers 308 may each include one or more of chemical vapor deposition (CVD), physical vapor deposition (PVD), and atomic layered deposition (ALD).

A plurality of lower channel hole portions 311 may be formed extending in the core region of lower dielectric stack 304-1. Lower channel hole portions 311 may each expose substrate 302 at the respective bottom portion. Lower channel hole portions 311 may be formed by a suitable patterning/etching process that removes portions of lower dielectric stack 304-1 to expose substrate 302. The etching process may include wet etch and/or dry etch. In some embodiments, a sacrificial material, such as polysilicon, is deposited to fill in lower channel hole portions 311 before the deposition of a second dielectric stack. The deposition of the sacrificial material may include any suitable deposition method such as CVD, PVD, and/or ALD. In some embodiments, a suitable planarization process, e.g., recess etch and/or chemical mechanical planarization (CMP), is performed to remove any excess dielectric materials and/or sacrificial materials over lower dielectric stack 304-1.

Referring back to FIG. 7, after the formation of the lower dielectric stack and lower channel hole portions, method 700 proceeds to operation 704, in which an upper dielectric stack is formed over the lower dielectric stack, forming a dielectric stack. FIG. 3 illustrates a corresponding structure.

As shown in FIG. 3, an upper dielectric stack 304-2 may be deposited over lower dielectric stack 304-1. Similar to lower dielectric stack 304-1, upper dielectric stack 304-2 may also include interleaved first dielectric layers 305 and second dielectric layers 308, which can be deposited by the same methods that form lower dielectric stack 304-1. The detailed description of the deposition of upper dielectric stack 304-2 is thus not repeated herein. Upper dielectric stack 304-2 and lower dielectric stack 304-1 form a dielectric stack 304, in which lower dielectric stack 304-1 is the lower deck and upper dielectric stack 304-2 is the upper deck.

Figure 4A:
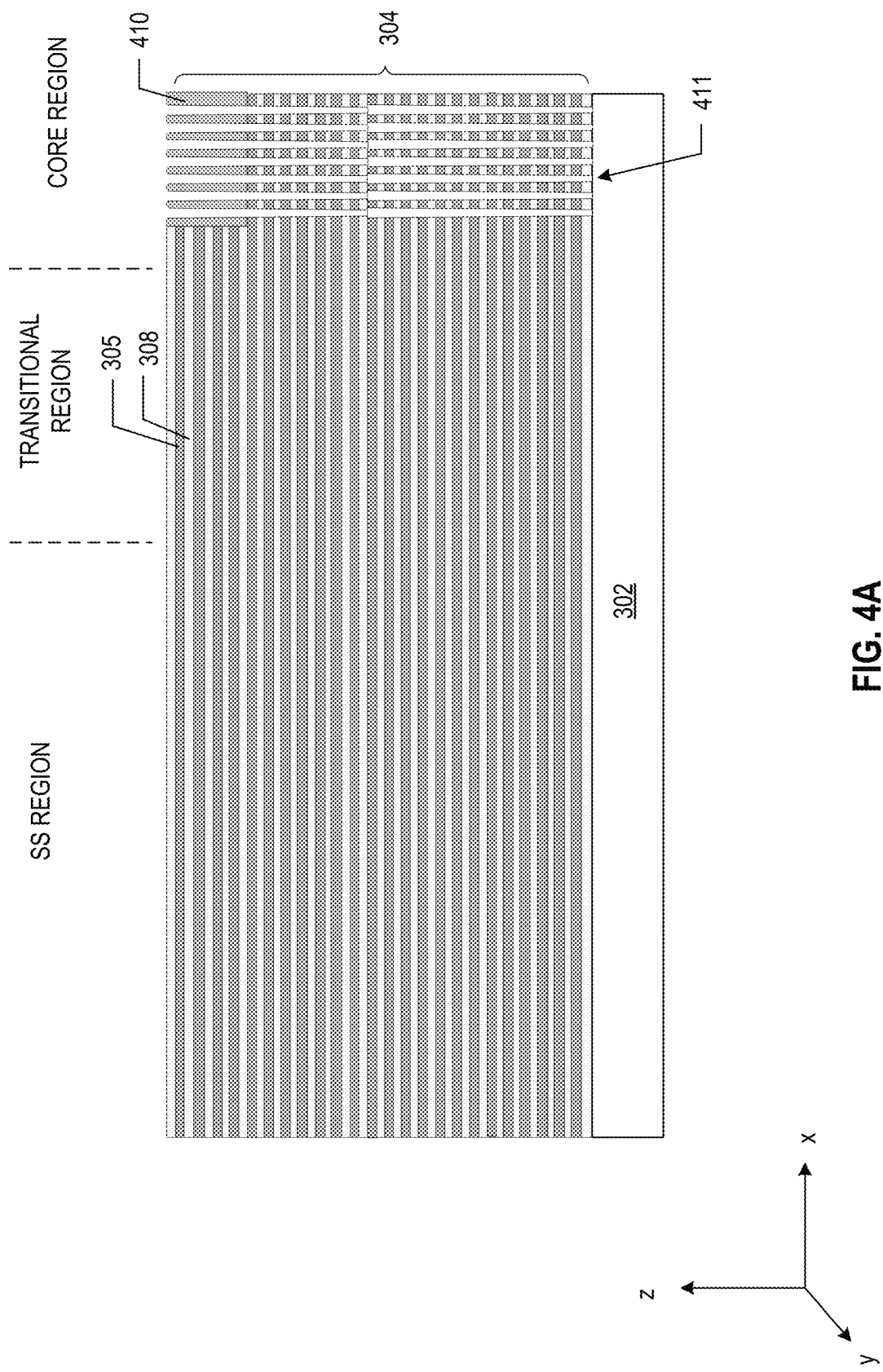
FIGS. 4A-4D illustrates cross-sectional views of a 3D memory device at various stages of another exemplary fabrication process, according to some embodiments of the present disclosure.

Referring back to FIG. 7, after the formation of the dielectric stack, method 700 proceeds to operation 706, in which a TSG cut structure is formed in the core region of the dielectric stack. FIG. 4A illustrates a corresponding structure.

As shown in FIG. 4A, a TSG cut structure 410 may be formed in the core region of dielectric stack 304. To form TSG cut structure 410, a TSG cut opening may be formed in the upper portion of dielectric stack 304 (e.g., in upper dielectric stack 304-2). The TSG cut opening may be a trench of a desired depth that extends in the x-z plane. The TSG cut opening may be formed at a suitable location, e.g., in the middle of a to-be-formed memory finger. In some embodiments, along the x-z plane, the TSG cut opening aligns with the lower channel hole portions 311 in the middle of a to-be-formed memory finger. In some embodiments, the depth of the TSG cut opening, along the z-axis, is equal to or greater than four first/second dielectric layer pairs. The TSG cut opening may be formed by a suitable etching process, e.g., dry etch and/or wet etch, to remove a portion of dielectric stack 304. A suitable dielectric material, e.g., silicon oxide and/or silicon oxynitride, can be deposited by one or more of CVD, PVD, and/or ALD, to fill up the TSG cut opening. In some embodiments, a suitable planarization process, e.g., recess etch and/or CMP, is performed to remove any excess dielectric materials over dielectric stack 304.

Figure 4B:
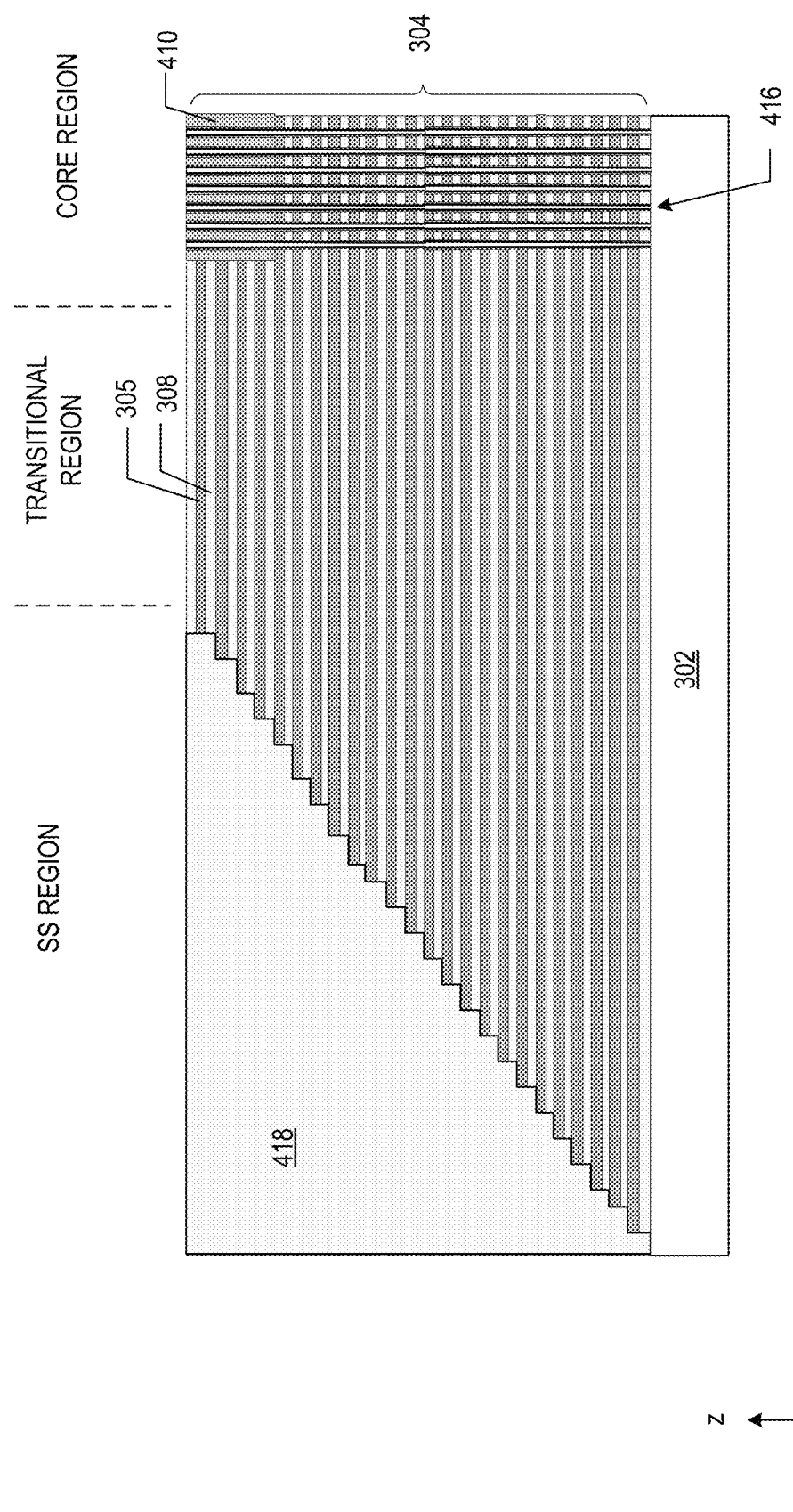

Referring back to FIG. 7, after the formation of the TSG cut structure, method 700 proceeds to operation 708, in which a plurality of channel holes and a plurality of channel structures are formed in the dielectric stack. FIGS. 4A and 4B illustrate corresponding structures.

As shown in FIG. 4A, a plurality of upper channel hole portions (or second channel hole portions) may be formed in dielectric stack 304 (e.g., upper dielectric stack 304-2), extending along the z-axis. Each upper channel hole portion may be aligned with a respective lower channel hole portion 311 along the z-axis, fully or partially exposing lower channel hole portion 311 (e.g., and/or the sacrificial material in lower channel hole portion 311). In some embodiments, a plurality of upper channel hole portions extend through TSG cut structure 410. The upper channel hole portion and a respective lower channel hole portion 311 may form a channel hole 411. The upper channel hole portions may be formed by a suitable patterning/etching process, such as dry etch and/or wet etch. In some embodiments, the sacrificial material in lower channel hole portion 311 is removed by a suitable etching process, e.g., wet etch and/or dry etch.

As shown in FIG. 4B, a plurality of channel structures (not shown) and a plurality of dummy channel structures 416 may be formed in each channel hole 411. A conductive plug (not shown) may be formed at the bottom of channel hole 411. The conductive plug, including a semiconductor material, may be formed by an epitaxial growth process and/or a deposition process. In some embodiments, the conductive plug is formed by epitaxial growth (e.g., selective epitaxial growth) and is referred to as an epitaxial portion. In some embodiments, the conductive plug includes single crystalline silicon and is formed by epitaxially grown from substrate 302. In some embodiments, the conductive plug includes polysilicon formed by a deposition process. The formation of epitaxially-grown epitaxial portion can include, but not limited to, vapor-phase epitaxy (VPE), liquid-phase epitaxy (LPE), molecular-beam epitaxy (MPE), or any combinations thereof. The formation of the deposited epitaxial portion may include, but not limited by, CVD, PVD, and/or ALD.

A plurality of channel-forming materials can then be deposited in channel hole 411 over the conductive plug. In some embodiments, a memory film and a semiconductor layer are deposited in channel hole 411. Specifically, the memory film may include a blocking layer, a memory layer, and a tunneling layer. Optionally, a dielectric core is deposited in channel hole 411 to partially or fully fill up the space. In some embodiments, the dielectric core, semiconductor layer, the tunneling layer, the memory layer, and the blocking layer are arranged radially from the center toward the sidewall of channel hole 411 in this order. In some embodiments, the semiconductor layer is in contact with the conductive plug, and a semiconductor channel is formed in the semiconductor layer. In some embodiments, the blocking layer, the memory layer, the tunneling layer the semiconductor layer, and the dielectric core can be sequentially deposited in this order using one or more thin film deposition processes, such as ALD, CVD, PVD, any other suitable processes, or any combination thereof.

In some embodiments, a drain structure is formed in the upper portion of channel hole 411. In some embodiments, parts of the memory film, semiconductor layer, and dielectric core in the upper portion of the channel hole can be removed by CMP, grinding, wet etching, and/or dry etching to form a recess in the upper portion of the channel hole so that a top surface of semiconductor channel may be located at a desired position in channel hole 411. The drain structure then can be formed by depositing conductive materials, such as metals and/or silicon, into the recess by one or more thin film deposition processes, such as CVD, PVD, ALD, electroplating, electroless plating, or any combination thereof. The channel structures can then be formed outside of TSG cut structure 410, and dummy channel structures 416 may be formed aligned with (or extending in) TSG cut structures 410. Optionally, a planarization process, e.g., dry/wet etch and/or CMP, is performed to remove any excess material on the top surface of dielectric stack 304. In subsequent fabrication operations, bit lines may be formed to be electrically connected to the channel structures. In some embodiments, no bit line is formed to be electrically connected to dummy channel structures 416.

Referring back to FIG. 7, after the formation of the channel structure, method 700 proceeds to operation 710, in which a staircase structure is formed in the staircase region of the dielectric stack. FIG. 4B illustrates a corresponding structure.

As shown in FIG. 4B, a staircase structure, including a plurality of stairs extending along the x-axis, can be formed in the staircase region of dielectric stack 304. The staircase structure can be formed by repetitively etching the plurality of interleaved first dielectric layers 305 and second dielectric layers 308 using an etch mask, e.g., a patterned PR layer over dielectric stack 304. Each first dielectric layer 305 and the underlying second dielectric layer 308 may be referred to as a dielectric pair. In some embodiments, one or more dielectric pairs can form one level/stair. During the formation of the staircase structure, the PR layer is trimmed (e.g., etched incrementally and inwardly from the boundary of the stack structure, often from all directions) and used as the etch mask for etching the exposed portion of dielectric stack 304. The amount of trimmed PR can be directly related (e.g., determinant) to the dimensions of the staircases. The trimming of the PR layer can be obtained using a suitable etch, e.g., an isotropic dry etch such as a wet etch. One or more PR layers can be formed and trimmed consecutively for the formation of the staircase structure. Each dielectric pair can be etched, after the trimming of the PR layer, using suitable etchants to remove a portion of both the first dielectric layer 305 and the underlying second dielectric layer 308. The etched first dielectric layers 305 and second dielectric layers 308 may form the stairs. The PR layer can then be removed. In some embodiments, an insulating structure 418 is deposited to surround dielectric stack 304 such that dielectric stack 304 is in insulating structure 418. Insulating structure 418 may include any suitable insulating material such as silicon oxide and may be deposited by a suitable deposition process such as CVD, PVD, and/or ALD.

Figure 4C:
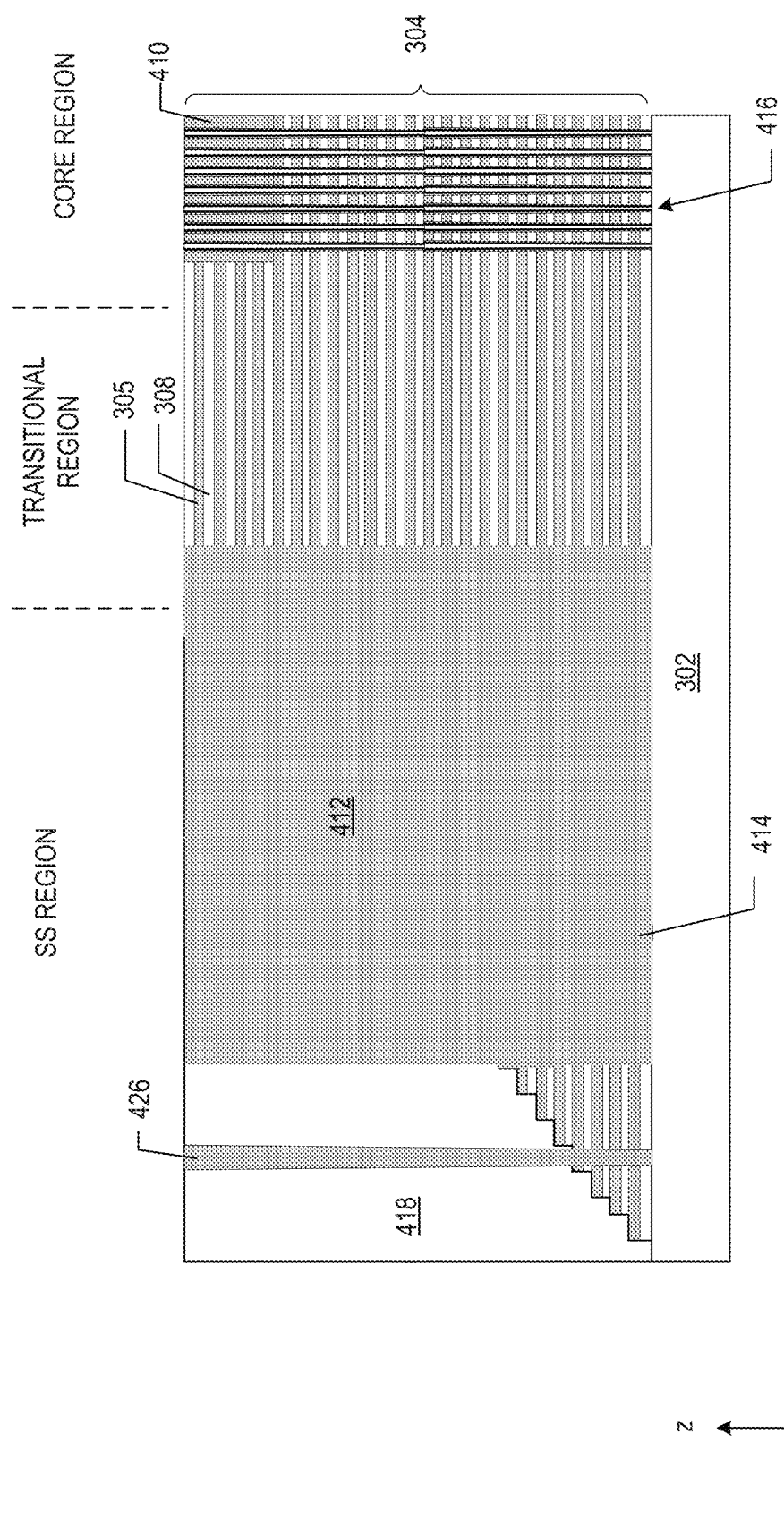

Referring back to FIG. 7, after the formation of the staircase structure, method 700 proceeds to operation 712, in which a second TSG cut structure and a plurality of support structures are formed in the same operations in the staircase structure. FIG. 4C illustrates a corresponding structure.

As shown in FIG. 4C, a second TSG cut structure 412 and a plurality of support structures 414 and 426 are formed in the staircase region of dielectric stack 304 in the same operations. To form second TSG cut structure 412 and support structures 414 and 426, a second TSG cut opening and a plurality of support openings can be formed in the staircase region. In some embodiments, the second TSG cut opening and the support openings are formed, by the same patterning/etching process, in the staircase structure and insulating structure 418 (if any). In some embodiments, a photomask that has the pattern for the second TSG cut opening and the support openings is used to pattern the portion of dielectric stack 304 and insulating structure 418 (if any) in the staircase region. A suitable etching process, e.g., dry etch and/or wet etch, may be performed to remove portions of dielectric stack 304 and insulating structure 418 (if any) to form the second TSG cut opening and the support openings at the same time. Along the z-axis, the second TSG cut opening may extend from the top surface of dielectric stack 304 (or insulating structure 418, if any) to at least the fourth first dielectric layer 305 under the top surface of each stair. In some embodiments, as shown in FIG. 4C, the second TSG cut opening extends from the top surface of dielectric stack 304 (or insulating structure 418, if any) to the bottom of the staircase structure (or substrate 302).

Along the z-axis, the support openings may extend from the top surface of dielectric stack 304 (or insulating structure 418, if any) to the bottom of the staircase structure (or substrate 302). In some embodiments, a first portion of the support openings extends in and is aligned with the second TSG cut opening in the x-z plane, and a second portion of the support openings extends outside of the second TSG cut opening. The first portion of the support openings may have dimensions and shapes corresponding to support structures 114, and the second portion of the support openings may have dimensions and shapes corresponding to support structures 126.

A suitable deposition process, CVD, PVD, and/or ALD, can be performed to deposit a dielectric material in the second TSG cut opening and the support openings, forming second TSG cut structure 412 and support structures 414 and 426 at the same time. In some embodiments, the dielectric material includes silicon oxide. Optionally, a planarization process, e.g., dry/wet etch and/or CMP, is performed to remove any excess material on the top surface of dielectric stack 304.

In various embodiments, the order and/or process to form TSG cut structure 410, dummy channel structures 416, second TSG cut structure 412, and support structures 414 and 426 can vary. For example, the TSG cut opening in the core region may not be filled with dielectric material before the formation of dummy channel structures 416. That is, channel holes 411 may first be filled with a memory film, a semiconductor layer, and a dielectric core, before the deposition of the dielectric material that fills the TSG cut opening. Accordingly, dummy channel structure 416 may extend only under TSG cut structure 410, instead of extending through TSG cut structure 410 as illustrated in FIGS. 4A-4C. The specific order to form TSG cut structure 410 and dummy channel structures 416 (and the channel structures) should not be limited by the embodiments of the present disclosure. In another example, the TSG cut opening, the second TSG cut opening, and the support openings may be filled by the same deposition process with the same dielectric material, forming TSG cut structure 410, second TSG cut structure 412, and support structures 414 and 426 at the same time.

Figure 4D:
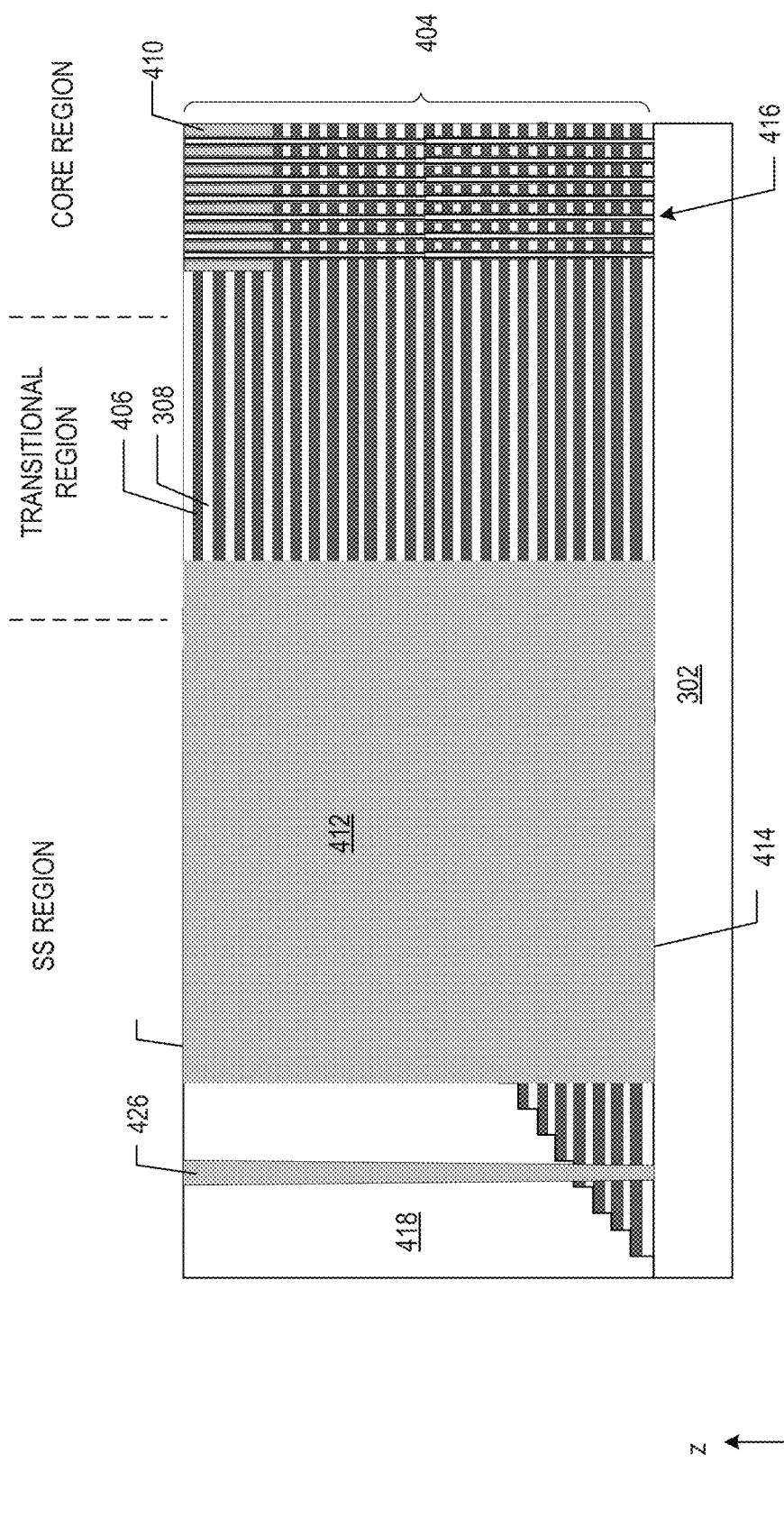

Referring back to FIG. 7, after the formation of the second TSG cut structure and the support structures, method 700 proceeds to operation 714, in which a memory stack, a source contact structure, and a contact are formed. FIG. 4D illustrates a corresponding structure.

As shown FIG. 4D, a memory stack 404, having interleaved a plurality of conductor layers 406 and dielectric layers 308, can be formed. The memory stack can also be referred to as a stack structure. A source contact structure (referring back to source contact structure 124 in FIG. 1C) and a plurality of contacts (referring back to contacts 130 in FIG. 1C), can also be formed. To form memory stack 404, a plurality of slit opening, extending along the x-axis in the core region and the staircase region, can be formed in dielectric stack 304. The slit openings may each expose the plurality of first dielectric layers 305 on the sidewalls and substrate 302 at the bottom. The slit opening may each be formed by a suitable patterning/etching process, such as dry etch and/or wet etch.

An isotropic etching process may then be performed to remove first dielectric layer 305 through each slit opening. A plurality of lateral recesses may be formed in dielectric stack 304. A conductor material may then be deposited to fill in the lateral recesses, forming a plurality of conductor layers 406. Conductor layers 406 and dielectric layers 308 may be arranged alternatingly along the z-axis above substrate 302, forming a plurality of conductor/dielectric layer pairs. In some embodiments, the conductor material is deposited by at least one of CVD, PVD, and ALD. Memory stack 404 is then formed.

In some embodiments, a doped region is formed in substrate 302 at the bottom portion of each slit opening, e.g., using a suitable doping process such as ion implantation. In some embodiments, an insulating material, such as silicon oxide, is deposited over the sidewall of each slit opening, forming an insulating spacer. Optionally, a suitable recess etching process, e.g., dry etch and/or wet etch, may be performed to remove any excess portion of the insulating material and expose substrate 302. A conductive material may be deposited to fill in each slit opening, forming a source contact. In some embodiments, the source contact includes a suitable conductive material such as tungsten, polysilicon, silicides, cobalt, aluminum, copper, etc. The insulating spacer may each be deposited by one or more of CVD, PVD, ALD, and the source contact may each be deposited by one or more of CVD, PVD, ALD, and electroplating. Optionally, a planarization process, e.g., CMP and/or recess etch, is performed to remove any excess material over memory stack 404.

Figure 8:
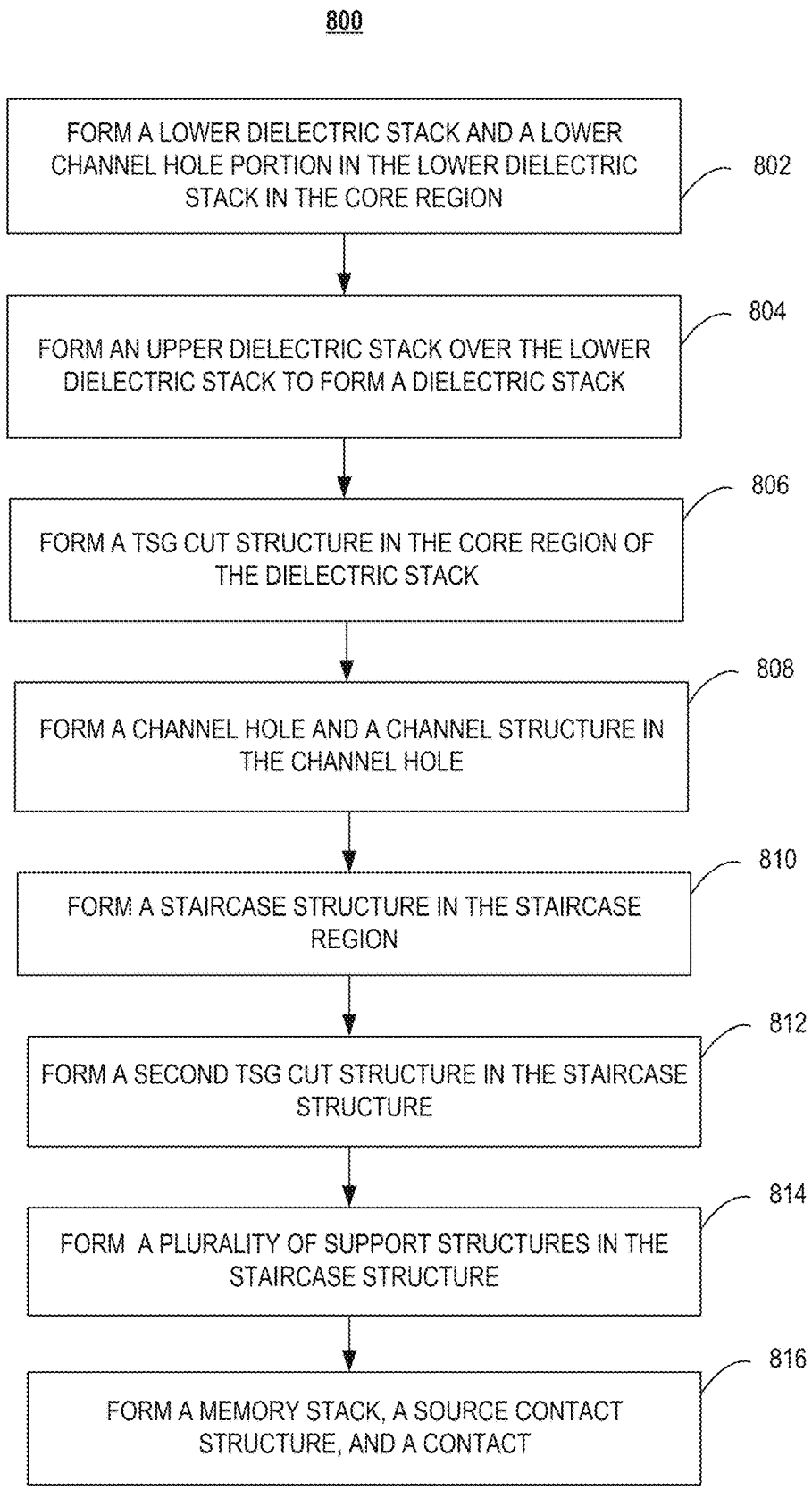
FIG. 8 illustrates a flowchart of exemplary fabrication operations shown in FIGS. 3, and 5A-5D, according to some embodiments of the present disclosure.

FIGS. 3 and 5A-5D illustrate cross-sectional views of 3D memory device 200 at various stages of a fabrication process, according to some embodiments. FIG. 8 illustrates a flowchart of a method 800 for forming 3D memory device 200. For ease of illustration, the fabrication process of 3D memory device 200 having a dual-deck structure is described, similar to the description of method 700. It is understood that the operations shown in method 800 are not exhaustive and that other operations can be performed as well before, after, or between any of the illustrated operations. Further, some of the operations may be performed simultaneously, or in a different order than shown in FIGS. 3, 4A, 4B, and 5A-5C. For ease of illustration, the description of the operations that are similar to or the same as any of Operations 702-714 is not repeated herein.

As shown in FIG. 8, Operations 802-810 may be the same as or similar to Operations 702-710. FIG. 3 illustrates the structure of 3D memory device formed by Operations 802 and 804. FIG. 5A illustrates the structure of 3D memory device formed by Operations 806-810. However, as an example, in FIGS. 5A-5D, a TSG cut structure 510 in the core region is formed after the formation of dummy channel structures 516. As shown in FIG. 5A, a TSG cut opening 513 may first be formed in the core region. The upper channel hole portions may then be formed to be in contact with respective lower channel hole portions 311, forming a plurality of channel holes 515. In some embodiments, dummy channel structures 516 are formed in channel holes 515 under TSG cut opening 513, and the channel structures (not shown) are formed in channel holes 515 outside of TSG cut opening 513. A channel forming structure, the same as or similar to that of dummy channel structures 416, can then be formed in each channel hole 515, using the same or similar deposition methods that form dummy channel structures 416. A dielectric material may then be deposited into the TSG cut opening to form TSG cut structure 510. Optionally, a recess etching process (e.g., wet etch and/or dry etch) is performed to remove the deposited channel-forming materials in the TSG cut opening before the deposition of the dielectric material that forms TSG cut structure 510. The materials and deposition methods to form dummy channel structures 516 and TSG cut structure 510 can be similar to or the same as those for forming dummy channel structures 416 and TSG cut structure 410. The detailed description is not repeated herein. In some embodiments, the channel structures (e.g., similar to channel structures 117) are formed by the same operations that form dummy channel structures 516. In some embodiments, a staircase structure is formed in the staircase region of the 3D memory device (or dielectric stack 304). The formation of the staircase structure can be similar to or the same as that described in Operation 710, and the detailed description is not repeated herein. Optionally, insulating structure 418 is formed over dielectric stack 304 such that the dielectric stack 304 is in insulating structure 418.

Referring back to FIG. 8, after the formation of the staircase structure in the staircase region, method 800 proceeds to Operation 812, in which a second TSG cut structure is formed in the staircase region. FIGS. 5B and 5C illustrate corresponding structures.

As shown in FIG. 5B, a second TSG cut opening 511 may be formed in the staircase region of the 3D memory device (or dielectric stack 304). Along the z-axis, second TSG cut opening 511 may extend from at least the top surfaces of the stairs (or the top surface of insulating structure 418, if any) to at least the bottom surface of the fourth first dielectric layer 305 of respective stairs. In some embodiments, the depth of second TSG cut opening 511 in the staircase structure is equal to or greater than four first/second dielectric layer pairs. In some embodiments, the depth of second TSG cut opening 511 is equal to or greater than the distances between the top surfaces of the respective stairs (or the distance between the top surface of insulating structure 418) and the bottom of the fourth first dielectric layer 305 of the stairs. A suitable etching process, similar to or the same as the etching process described in Operation 712, may be performed to remove portions of dielectric stack 304 (or insulating structure 418, if any) and form second TSG cut opening 511. As shown in FIG. 5C, after second TSG cut opening 511 is formed, a suitable dielectric material can be deposited to form second TSG cut structure 512. The material and deposition methods to form second TSG cut structure 512 can be the same as or similar to those for forming second TSG cut structure 412, and the detailed description is not repeated herein.

Referring back to FIG. 8, after the formation of the second TSG cut structure in the staircase region, method 800 proceeds to Operation 814, in which a plurality of support structures are formed in the staircase region. FIG. 5C illustrates a corresponding structure.

As shown in FIG. 5C, a plurality of support structure 514 are formed in the staircase region, extending from at least the top surfaces of the stairs to the bottom of the staircase structure (or the top surface of substrate 302). To form support structure 514, a plurality of support openings can first be formed in the staircase region, extending from at least the top surfaces of the stairs to the bottom of the staircase structure (or the top surface of substrate 302). In some embodiments, the support openings extend from the top surface of insulating structure 418 to substrate 302. The locations and dimensions of the support openings may be referred to the description of support structures 214, and the detailed description is not repeated herein. A suitable etching process, e.g., similar to or the same as the etching process in Operation 712, may be performed to remove portions of insulating structure 418, dielectric stack 304, and second TSG cut structure 512 (if formed) to form the support openings. Along the z-axis, the support opening may extend from the top surfaces of the stairs in the staircase region of dielectric stack 304 (or insulating structure 418, if any) to the bottom of the staircase structure (or substrate 302). A suitable dielectric material can be deposited to fill in the support openings and form support structure 514. The material and deposition methods to form support structures 514 can be the same as or similar to those for forming support structures 414, and the detailed description is not repeated herein.

As shown in method 800, different from method 700, second TSG cut opening 511 (in which second TSG cut structure 512 is formed) and the support openings (in which the support structures 514 are formed) are formed by different patterning/etching processes. That is, separate photomasks can be used for the formation of second TSG cut opening 511 and the support openings in the staircase region. In various embodiments, the order to form second TSG cut opening 511 and the support openings can vary in different fabrication processes. For example, in some embodiments, the support openings are formed before second TSG cut opening 511. In some embodiments, in Operations 812 and 814, instead of being filled with a dielectric material in separate operations, second TSG cut opening 511, and the support openings are filled with the same dielectric material, such as silicon oxide, by the same deposition process, such as CVD, PVD, and/or ALD. The specific order to form and fill second TSG cut opening 511 and the support openings should not be limited by the embodiments of the present disclosure.

Referring back to FIG. 8, after the formation of the second TSG cut structure and the support structures, method 800 proceeds to operation 816, in which a memory stack, a source contact structure, and a contact are formed. FIG. 5D illustrates a corresponding structure.

As shown in FIG. 5D, a memory stack 504, having interleaved a plurality of conductor layers 406 and dielectric layers 308, can be formed. A plurality of source contact structures (similar to or the same as 124) and a plurality of contacts (similar to or the same as 130) can be formed in the 3D memory device. The fabrication process and materials to form those structures can be similar to those described in Operation 714, and the detailed description is not repeated herein.

Figure 9:
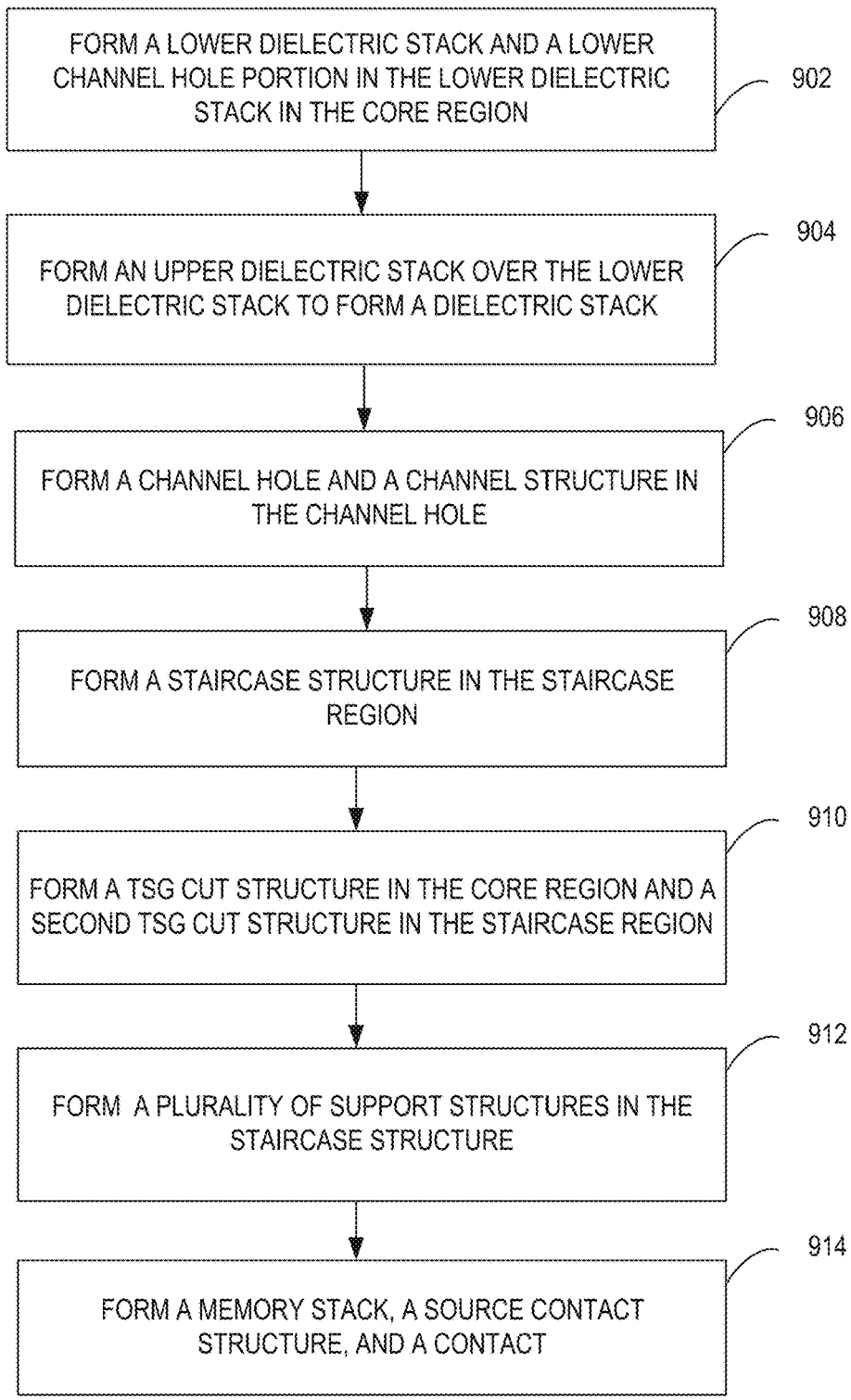
FIG. 9 illustrates a flowchart of exemplary fabrication operations shown in FIGS. 3 and 6A-6D, according to some embodiments of the present disclosure.

FIGS. 3 and 6A-6D illustrate cross-sectional views of 3D memory device 200 at various stages of another fabrication process, according to some embodiments. FIG. 9 illustrates a flowchart of a method 900 for forming 3D memory device 200. For ease of illustration, the fabrication process of 3D memory device 200 having a dual-deck structure is described, similar to the description of methods 800 and 700. It is understood that the operations shown in method 900 are not exhaustive and that other operations can be performed as well before, after, or between any of the illustrated operations. Further, some of the operations may be performed simultaneously, or in a different order than shown in FIGS. 3 and 6A-6D. For ease of illustration, the description of the operations that are similar to or the same as any of Operations 702-714 is not repeated herein. As shown in FIG. 9, Operations 902 and 904 may be the same as or similar to Operations 702 and 704. FIG. 3 illustrates the structure of 3D memory device formed by Operation 904.

Referring back to FIG. 9, after the formation of the dielectric stack, method 900 proceeds to operation 906, in which a channel hole is formed in the core region, and a channel structure is formed in the channel hole. FIGS. 6A and 6B illustrate corresponding structures.

As shown in FIG. 6A, an upper channel hole portion is formed in the upper dielectric stack, aligned and in contact with each lower channel hole portion, forming a channel hole 615. Channel structures (e.g., similar to 117) and dummy channel structures (e.g., similar to 216) may be subsequently formed in channel holes 615. The patterning/etching process to form channel holes 615 is similar to or the same as the patterning/etching process that forms channel holes 411, and the detailed description is not repeated herein. In some embodiments, an alignment mark is used in the patterning/etching of the upper channel hole portions such that each upper channel hole portion is aligned with (or at least partially overlapped with) the respective lower channel hole portion.

As shown in FIG. 6B, a channel structure 617 is formed in each channel hole 615. The materials and methods to form channel structures 617 are similar to or the same as those form dummy channel structures 416, and the detailed description is not repeated herein.

Referring back to FIG. 9, after the formation of the channel structures, method 900 proceeds to operation 908, in which a staircase structure is formed in the staircase region of the dielectric stack. FIG. 6B illustrates a corresponding structure.

As shown in FIG. 6B, a staircase structure, having a plurality of stairs extending along the x-axis, is formed in the staircase region of the 3D memory device (or dielectric stack 304). The formation of the staircase structure may be similar to that described in Operation 710, and the detailed description is not repeated herein. Optionally, insulating structure 418 is formed over the staircase structure such that dielectric stack 304 is in insulating structure 418.

Referring back to FIG. 9, after the formation of the staircase structure, method 900 proceeds to operation 910, in which a TSG cut structure is formed in the core region and a second TSG cut structure is formed in the staircase region of the dielectric stack. FIG. 6C illustrates a corresponding structure.

As shown in FIG. 6C, a TSG cut structure 610 and a second TSG cut structure 612 are respectively formed in the core region and the staircase region by the same fabrication operations. To form TSG cut structure 610 and second TSG cut structure 612, in some embodiments, a TSG cut opening (in which TSG cut structure 610 is formed) and a second TSG cut opening (in which second TSG cut structure 612 is formed) are respectively formed in the core region and the staircase region, by the same patterning/etching process. In some embodiments, a single photomask is used to simultaneous pattern the TSG cut opening and the second TSG cut opening. In some embodiments, to form the TSG cut opening, a suitable etching process is employed to remove a portion of dielectric stack 304 in the core region, which includes upper portions of channel structures 617 and portions of first/second dielectric layer pairs. Dummy channel structure 616 may be formed after the formation of the TSG cut opening (e.g., formed by the channel structures 617 after the top portions are removed). The same etching process may be employed to remove a portion of dielectric stack 304 in the staircase region to form the second TSG cut opening. In some embodiments, the depths and dimensions of the TSG cut opening and the second TSG cut opening can be referred to those described in FIGS. 5A-5C, and the detailed description is not repeated herein. In some embodiments, the etching process employed to form the TSG cut opening and the second TSG cut opening includes dry etch and/or wet etch. A suitable deposition process, can then be performed to fill the TSG cut opening and the second TSG cut opening with a suitable dielectric material, forming TSG cut structure 610 and second TSG cut structure 612. The dielectric material and deposition methods can be referred to as those described in Operation 712, and the detailed description is not repeated herein.

Referring back to FIG. 9, after the formation of the TSG cut structure and the second TSG cut structure, method 900 proceeds to operation 912, in which a plurality of support structures are formed in the staircase region of the dielectric stack. FIG. 6D illustrates a corresponding structure.

As shown in FIG. 6D, a plurality of support structures 614 are formed in the staircase region of the 3D memory device (or dielectric stack 304), extending along the z-axis in the staircase structure, second TSG cut structure 612, and insulating structure 418 (if formed). In some embodiments, a separate photomask (e.g., than the photomask used to form the TSG cut opening and the second TSG cut opening) is used for patterning/etching the support openings in which support structures 614 are formed. The formation of support structures 614 is similar to that of support structures 514, and the detailed description is not repeated herein.

Referring back to FIG. 9, after the formation of the support structures, method 900 proceeds to operation 914, in which a memory stack, a source contact structure, and a contact are formed. FIG. 6D illustrates a corresponding structure.

As shown in FIG. 6D, a memory stack 604, having interleaved a plurality of conductor layers 406 and dielectric layers 308, can be formed. A plurality of source contact structures (similar to or the same as 124) and a plurality of contacts (similar to or the same as 130) can be formed in the 3D memory device. The fabrication process and materials to form those structures can be similar to those of Operation 714, and the detailed description is not repeated herein.

Embodiments of the present disclosure provide a 3D memory device. The 3D memory device includes a core region and a staircase region having a plurality of stairs each has at least a conductor/dielectric pair extending in a lateral direction, the staircase region. The staircase region includes a DSG cut structure extending along the lateral direction and a vertical direction, and a plurality of support structures extending in the DSG structure along the vertical direction. Of at least one of the support structures, a dimension along the lateral direction is greater than a dimension along a second lateral direction perpendicular to the lateral direction.

In some embodiments, along the second lateral direction, the dimension of the at least one of the support structures is greater than a dimension of the DSG structure.

In some embodiments, along a lateral plane, the at least one of the support structures has one of an oval shape or a rectangular shape.

In some embodiments, the plurality of the support structures each includes an oval shape and are arranged evenly along the lateral direction.

In some embodiments, a dimension of the DSG structure is equal to at least four pairs of conductor/dielectric pairs along the vertical direction.

In some embodiments, along the vertical direction, dimensions of the plurality of support structures are greater than or equal to the dimension of the DSG structure.

In some embodiments, the plurality of support structures extend to a bottom of the staircase region.

In some embodiments, the DSG structure extends from surfaces of the plurality of staircases to a bottom of the staircase region.

In some embodiments, the DSG cut structure and the plurality of support structure include at least one of silicon oxide or silicon oxynitride.

In some embodiments, the 3D memory device further includes a second support structure outside of the DSG structure. Of the second support structure, a dimension along the lateral direction is greater than a dimension along the second lateral direction.

In some embodiments, the second support structure and the plurality of support structures have the same shapes, same dimensions, and same materials.

Embodiments of the present disclosure provide a method for forming a 3D memory device. The method includes the following operations. First, a dielectric stack having a plurality of first/second dielectric layer pairs over a substrate is formed. A DSG cut opening is formed in a core region of the dielectric stack. A staircase structure having a plurality of stairs is formed extending along a lateral direction in a staircase region of the dielectric stack. In a different process than the DSG cut opening, a second DSG cut opening is formed in the staircase region and extending along the lateral direction. A DSG cut structure is formed in the DSG cut opening and a second DSG cut structure is formed in the second DSG cut opening.

In some embodiments, the method further includes forming, in a same process that forms the second DSG cut opening, a plurality of support openings extending along a vertical direction in the staircase region and being at least partially overlapped with the second DSG cut opening. In some embodiments, the method further includes forming a plurality of support structures in the plurality of support openings.

In some embodiments, the method further includes forming, in a different process that forms the second DSG cut opening, a plurality of support openings extending along a vertical direction in the staircase region. In some embodiments, the method further includes forming a plurality of support structures in the plurality of support openings.

In some embodiments, forming the DSG cut structure, the second DSG cut structure, and the plurality of support structures include depositing a dielectric material respectively in the DSG cut opening, the second DSG cut opening, and the plurality of support openings.

In some embodiments, the dielectric material is deposited in a same process to form the DSG cut structure, the second DSG cut structure, and the plurality of support structures.

In some embodiments, the DSG cut opening is formed before a formation of the staircase structure.

In some embodiments, forming the second DSG cut opening includes removing a portion of the dielectric stack that includes at least four first/second dielectric layer pairs.

In some embodiments, forming the second DSG cut opening includes removing a portion of the dielectric stack to expose the substrate.

In some embodiments, forming the plurality of support openings includes removing a plurality of portions of the dielectric stack to expose the substrate.

In some embodiments, forming the dielectric stack includes forming a first dielectric stack over the substrate and forming a second dielectric stack over the first dielectric stack.

In some embodiments, the method further includes forming a first channel hole portion in the core region in the first dielectric stack before a formation of the DSG cut opening and forming a second channel hole portion in the second dielectric stack after a formation of the DSG cut opening. The second channel hole portion is in contact with the first channel hole portion, and the first and second channel hole portions form a channel hole.

In some embodiments, the method further includes depositing a channel-forming structure in the channel hole.

In some embodiments, the method further includes forming a slit structure in the dielectric stack, the slit structure extending along the lateral direction and exposing the substrate. In some embodiments, the method further includes removing the first dielectric layers to form a plurality of lateral recesses and depositing a conductor material in the plurality of lateral recesses to form a plurality of conductor layers.

Embodiments of the present disclosure provide a method for forming a 3D memory device. The method includes the following operations. First, a dielectric stack having a plurality of first/second dielectric layer pairs is formed over a substrate. A channel structure is formed in a core region of the dielectric stack. A staircase structure is formed having a plurality of stairs extending along a lateral direction in a staircase region of the dielectric stack. In a same process, a DSG cut opening is formed in a core region of the dielectric stack and a second DSG cut opening is formed in a staircase region of the dielectric stack. A DSG cut structure is formed in the DSG cut opening and a second DSG cut structure is formed in the second DSG cut opening.

In some embodiments, the method further includes forming, in a different process that forms the DSG cut opening and the second DSG cut opening, a plurality of support openings extending along a vertical direction in the staircase region. In some embodiments, the method further includes forming a plurality of support structures in the plurality of support openings.

In some embodiments, forming the DSG cut structure, the second DSG cut structure, and the plurality of support structures include depositing a dielectric material respectively in the DSG cut opening, the second DSG cut opening, and the plurality of support openings.

In some embodiments, the dielectric material is deposited in a same process to form the DSG cut structure, the second DSG cut structure, and the plurality of support structures.

In some embodiments, the DSG cut opening and the second DSG cut opening are formed after a formation of the staircase structure.

In some embodiments, forming the second DSG cut opening includes removing a portion of the dielectric stack that includes at least four first/second dielectric layer pairs.

In some embodiments, forming the plurality of support openings includes removing a plurality of portions of the dielectric stack to expose the substrate.

In some embodiments, forming the DSG cut opening includes removing a top portion of the channel structure.

In some embodiments, forming the dielectric stack includes forming a first dielectric stack over the substrate and forming a second dielectric stack over the first dielectric stack.

In some embodiments, the method further includes, before a formation of the staircase structure. In some embodiments, the method further includes forming a first channel hole portion in the core region in the first dielectric stack. In some embodiments, the method further includes forming a second channel hole portion in the second dielectric stack in contact with the first channel hole portion, the first and second channel hole portions forming a channel hole. In some embodiments, the method further includes depositing a channel-forming structure in the channel hole.

In some embodiments, the method further includes forming a slit structure in the dielectric stack, the slit structure extending along the lateral direction and exposing the substrate, removing the first dielectric layers to form a plurality of lateral recesses, and depositing a conductor material in the plurality of lateral recesses to form a plurality of conductor layers.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) memory device, comprising:
    forming a dielectric stack comprising a plurality of first/second dielectric layer pairs over a substrate;
    forming a drain-select-gate (DSG) cut opening in a core region of the dielectric stack;
    forming a staircase structure comprising a plurality of stairs extending along a lateral direction in a staircase region of the dielectric stack;
    forming, in a different process than the DSG cut opening, a second DSG cut opening in the staircase region and extending along the lateral direction;
    depositing a dielectric material to respectively fill up the DSG cut opening and the second DSG cut opening; and
    forming a DSG cut structure in the DSG cut opening and a second DSG cut structure in the second DSG cut opening, wherein the DSG cut structure and the second DSG cut structure are each a dielectric structure.

2. The method of claim 1, further comprising:
    forming, in a same process that forms the second DSG cut opening, a plurality of support openings extending along a vertical direction in the staircase region and being at least partially overlapped with the second DSG cut opening; and
    forming a plurality of support structures in the plurality of support openings.

3. The method of claim 2, wherein forming the plurality of support structures comprises depositing the dielectric material respectively in the plurality of support openings.

4. The method of claim 3, wherein the dielectric material is deposited in a same process to form the DSG cut structure, the second DSG cut structure, and the plurality of support structures.

5. The method of claim 2, wherein forming the plurality of support openings comprises removing a plurality of portions of the dielectric stack to expose the substrate.

6. The method of claim 1, further comprising:
forming, in a different process that forms the second DSG cut opening, a plurality of support openings extending along a vertical direction in the staircase region; and
forming a plurality of support structures in the plurality of support openings.

7. The method of claim 1, wherein the DSG cut opening is formed before a formation of the staircase structure.

8. The method of claim 1, wherein forming the second DSG cut opening comprises removing a portion of the dielectric stack that comprises at least four first/second dielectric layer pairs.

9. The method of claim 8, wherein forming the second DSG cut opening comprises removing a portion of the dielectric stack to expose the substrate.

10. The method of claim 1, wherein the second DSG cut opening is formed after a formation of the staircase structure.

11. A method for forming a three-dimensional (3D) memory device, comprising:
forming a dielectric stack comprising a plurality of first/second dielectric layer pairs over a substrate;
forming a pair of slit structures extending along a lateral direction in the dielectric stack;
forming a drain-select-gate (DSG) cut opening between and parallel to the slit structures in a core region of the dielectric stack;
forming a staircase structure comprising a plurality of stairs extending along the lateral direction in a staircase region of the dielectric stack;
forming, in a different process than the DSG cut opening, a second DSG cut opening between and parallel to the slit structures in the staircase region of the dielectric stack; and
forming a DSG cut structure in the DSG cut opening and a second DSG cut structure in the second DSG cut opening.

12. The method of claim 11, further comprising forming a plurality of channel structures in the core region, wherein a length of each of the DSG cut opening and the second DSG cut opening is greater than a length of at least two channel structures in the lateral direction.

13. The method of claim 11, wherein the second DSG cut opening is formed after a formation of the staircase structure.

14. The method of claim 13, wherein the DSG cut opening is formed after the formation of the staircase structure.

15. The method of claim 11, wherein the DSG cut opening is formed before a formation of the staircase structure.

16. The method of claim 11, further comprising:
forming, in a same process that forms the second DSG cut opening, a plurality of support openings extending along a vertical direction in the staircase region and being at least partially overlapped with the second DSG cut opening; and
forming a plurality of support structures in the plurality of support openings.

17. The method of claim 16, wherein forming the DSG cut structure, the second DSG cut structure, and the plurality of support structures comprise depositing a dielectric material respectively in the DSG cut opening, the second DSG cut opening, and the plurality of support openings.

18. The method of claim 11, further comprising:
forming, in a different process that forms the second DSG cut opening, a plurality of support openings extending along a vertical direction in the staircase region; and
forming a plurality of support structures in the plurality of support openings.

19. A method for forming a three-dimensional (3D) memory device, comprising:
forming a dielectric stack comprising a plurality of first/second dielectric layer pairs over a substrate;
forming a drain-select-gate (DSG) cut opening extending in a lateral direction in a core region of the dielectric stack;
forming a plurality of channel holes aligned and overlapped with the DSG cut opening in the core region in the lateral direction;
forming a staircase structure comprising a plurality of stairs extending along a lateral direction in a staircase region of the dielectric stack;
forming, in a different process than the DSG cut opening, a second DSG cut opening in the staircase region aligned with the DSG cut opening;
forming a plurality of dummy channel structures in the plurality of channel holes; and
forming a DSG cut structure in the DSG cut opening and a second DSG cut structure in the second DSG cut opening.

20. The method of claim 19, wherein the second DSG cut opening is formed after a formation of the staircase structure.

* * * * *